United States Patent
Seong et al.

(10) Patent No.: US 11,641,749 B2
(45) Date of Patent: May 2, 2023

(54) SEMICONDUCTOR DEVICE AND METHOD FOR FABRICATING THE SAME

(71) Applicant: Samsung Electronics Co., Ltd., Suwon-si (KR)

(72) Inventors: Dong Jun Seong, Seongnam-si (KR); Jun Hwan Paik, Hwaseong-si (KR); Hyung Jong Jeong, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 144 days.

(21) Appl. No.: 17/325,134

(22) Filed: May 19, 2021

(65) Prior Publication Data
US 2021/0273016 A1 Sep. 2, 2021

Related U.S. Application Data

(63) Continuation of application No. 16/378,749, filed on Apr. 9, 2019, now Pat. No. 11,037,985.

(30) Foreign Application Priority Data
Aug. 31, 2018 (KR) .................. 10-2018-0103252

(51) Int. Cl.
H01L 27/24 (2006.01)
H01L 45/02 (2006.01)
H01L 45/00 (2006.01)

(52) U.S. Cl.
CPC ...... *H01L 27/2427* (2013.01); *H01L 27/2481* (2013.01); *H01L 45/06* (2013.01); *H01L 45/126* (2013.01); *H01L 45/1233* (2013.01); *H01L 45/1246* (2013.01); *H01L 45/16* (2013.01)

(58) Field of Classification Search
CPC . H01L 27/2481; H01L 27/2427; H01L 45/06; H01L 45/1233; H01L 45/1246; H01L 45/16; H01L 45/12; H01L 45/1675
See application file for complete search history.

(56) References Cited

U.S. PATENT DOCUMENTS

| | | | |
|---|---|---|---|
| 7,589,343 B2 | 9/2009 | Lowrey | |
| 9,231,199 B2 | 1/2016 | Lee et al. | |
| 9,373,786 B1 | 6/2016 | Kamalanathan et al. | |
| 9,564,586 B2 | 2/2017 | Ha | |
| 9,640,588 B2 | 5/2017 | Sciarrillo et al. | |
| 9,691,475 B2 | 6/2017 | Redaelli | |
| 9,704,921 B2 | 7/2017 | Kim et al. | |
| 9,741,764 B1 * | 8/2017 | Terai | H01L 27/11582 |
| 9,935,263 B2 | 4/2018 | Cho | |
| 10,062,841 B2 * | 8/2018 | Park | H01L 45/1683 |

(Continued)

FOREIGN PATENT DOCUMENTS

| | | |
|---|---|---|
| JP | 2014530491 A | 11/2014 |
| KR | 101671860 B1 | 11/2016 |
| KR | 1020180069463 A | 6/2018 |

*Primary Examiner* — Jose R Diaz
(74) *Attorney, Agent, or Firm* — Muir Patent Law, PLLC

(57) ABSTRACT

A semiconductor device includes a first electrode and a first carbon layer on the first electrode. A switch layer is disposed on the first carbon layer and a second carbon layer is disposed on the switch layer. At least one tunneling oxide layer is disposed between the first carbon layer and the second carbon layer. The device further includes a second electrode on the second carbon layer.

20 Claims, 19 Drawing Sheets

(56) References Cited

U.S. PATENT DOCUMENTS

| | | |
|---|---|---|
| 2015/0123066 A1* | 5/2015 | Gealy ................ H01L 27/2427 257/4 |
| 2017/0200768 A1 | 7/2017 | Park |
| 2017/0244026 A1 | 8/2017 | Wu et al. |
| 2019/0058006 A1 | 2/2019 | Karpov et al. |

* cited by examiner

SEMICONDUCTOR DEVICE AND METHOD FOR FABRICATING THE SAME

This application is a continuation of U.S. patent application Ser. No. 16/378,749, filed Apr. 19, 2019, in the U.S. Patent and Trademark Office (USPTO), which claims priority from Korean Patent Application No. 10-2018-0103252 filed on Aug. 31, 2018 in the Korean Intellectual Property Office, the disclosure of both of which are incorporated herein by reference in their entireties.

BACKGROUND

1. Field of the Disclosure

The present disclosure relates to a semiconductor device and a method for fabricating the same.

2. Description of the Related Art

Semiconductor memory devices include volatile memory devices that lose stored information when the power is interrupted and non-volatile memory devices that retain stored information even if the power is interrupted.

A common type of non-volatile memory device is flash memory devices having a stacked gate structure. Resistive memory devices and phase-change memory devices have recently been proposed as replacements for flash memory devices.

SUMMARY

According to some exemplary embodiments, a semiconductor device includes a first electrode and a first carbon layer on the first electrode. A switch layer is disposed on the first carbon layer and a second carbon layer is disposed on the switch layer. At least one tunneling oxide layer is disposed between the first carbon layer and the second carbon layer. The device further includes a second electrode on the second carbon layer.

According to further exemplary embodiments, a semiconductor device includes a first electrode, a phase-change layer on the first electrode, and a second electrode on the phase-change layer. The device further includes a first carbon layer on the second electrode, an OTS (ovonic threshold switch) layer on the first carbon layer, and a second carbon layer on the OTS layer. A third electrode is disposed on the second carbon layer. At least one tunneling oxide layer is disposed between the first carbon layer and the second carbon layer.

According to still further exemplary embodiments, a semiconductor device includes a first word line extending in a first direction, a second word line extending in the first direction parallel to the first word line, and a bit line extending in a second direction intersecting the first direction and disposed between the first word line and the second word line. The device further includes a memory cell between the first word line and the bit line. The memory cell includes a first electrode, a first carbon layer on the first electrode, an OTS layer on the first carbon layer, a second carbon layer on the OTS layer, a second electrode on the second carbon layer, and at least one tunneling oxide layer between the first carbon layer and the second carbon layer. Second memory cell with a similar structure may be disposed between the second word line and the bit line.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION

Hereinafter, a semiconductor device according to some exemplary embodiments of the present disclosure will be described with reference to FIGS. 1 to 5.

Figure 1:
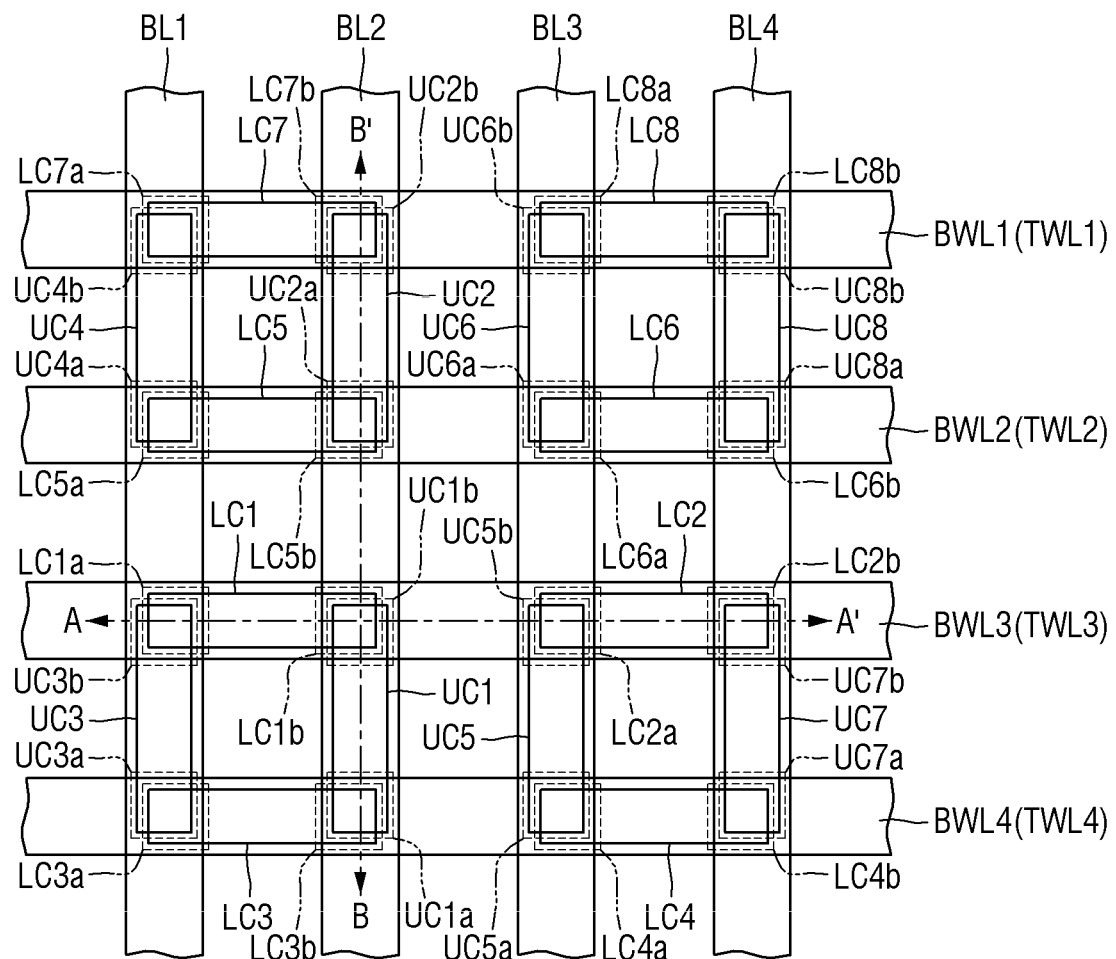
FIG. 1 is a layout diagram for illustrating a semiconductor device according to some exemplary embodiments of the present disclosure.
Figure 1:
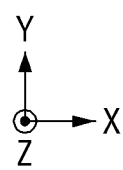
Figure 2:
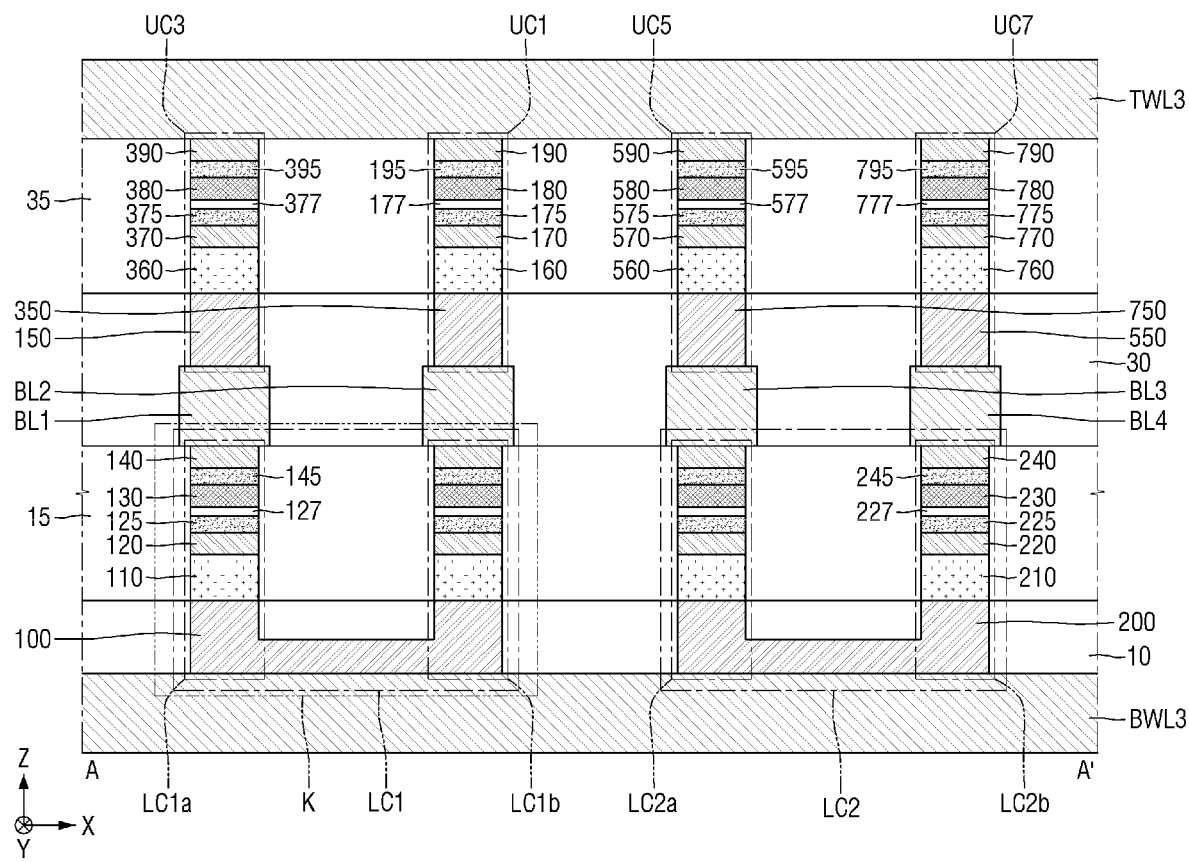
FIG. 2 is a cross-sectional view taken along line A-A' of FIG. 1.
Figure 3:
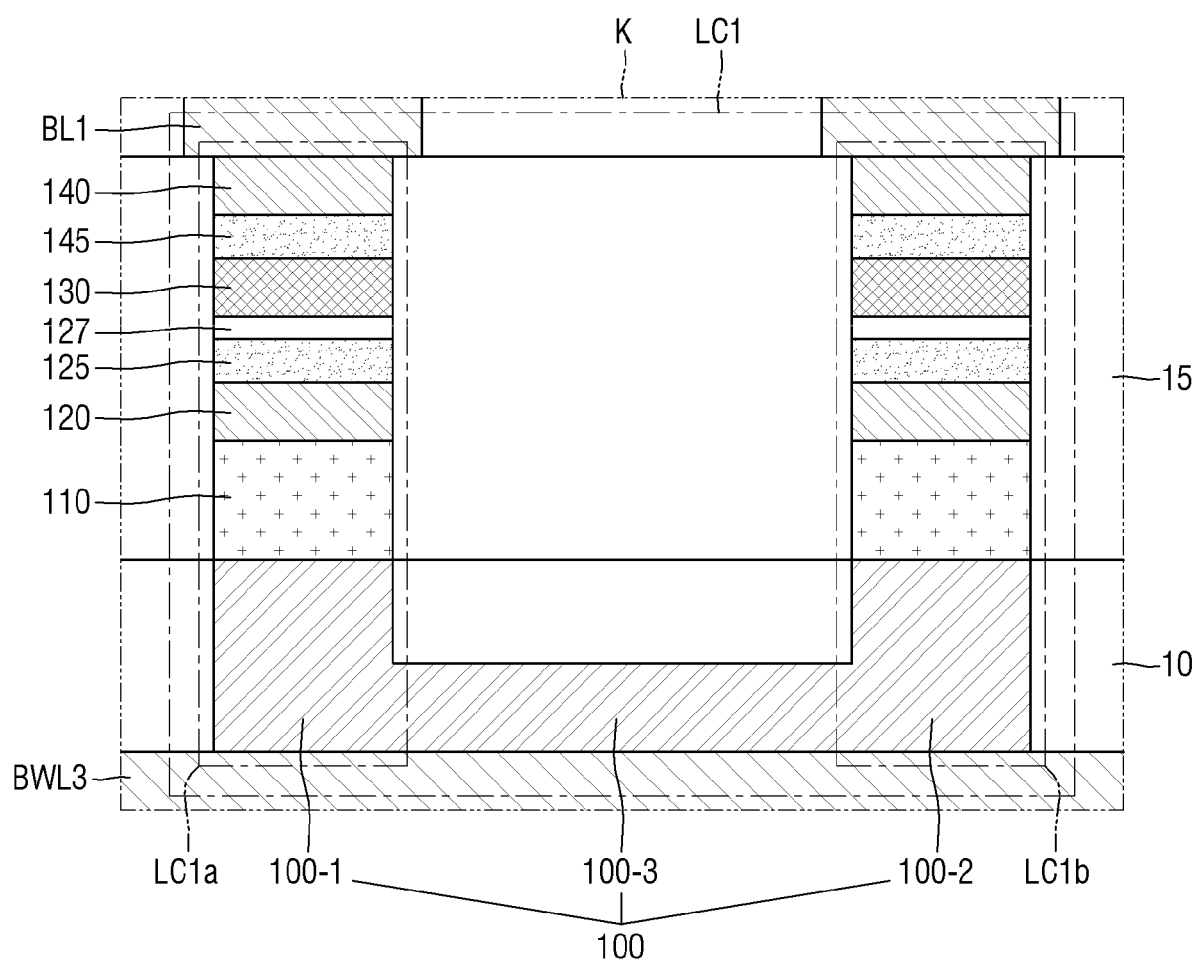
FIG. 3 is an enlarged cross-sectional view of portion K of FIG. 2.
Figure 4:
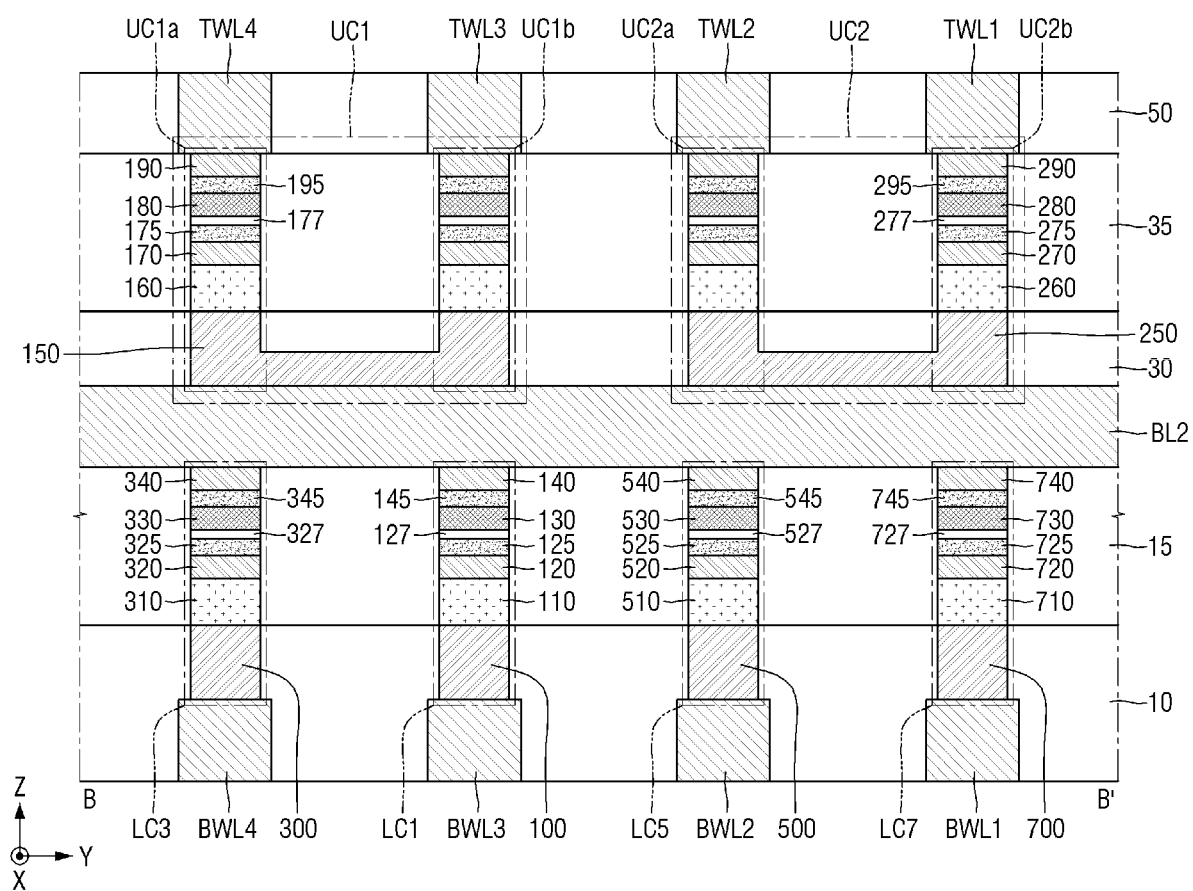
FIG. 4 is a cross-sectional view taken along line B-B' of FIG. 1.
Figure 5:
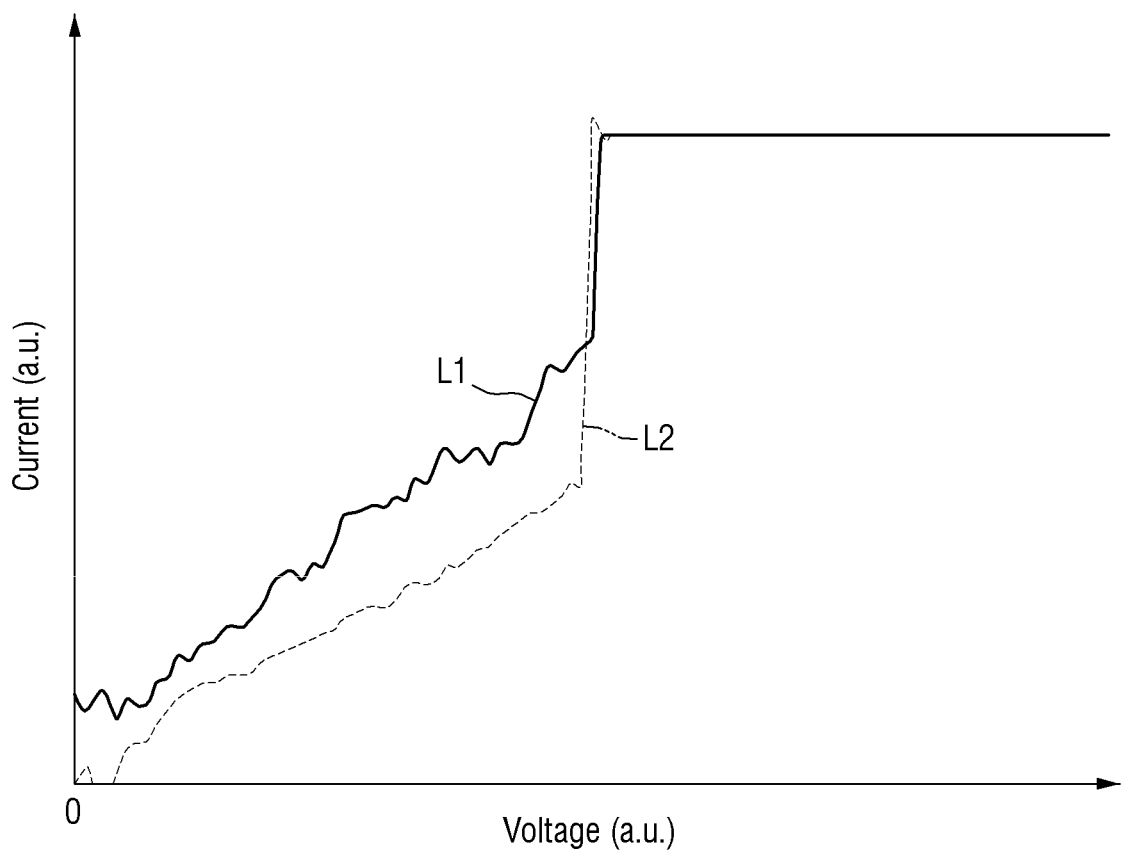
FIG. 5 is a graph for illustrating an off-current of the semiconductor device of FIG. 1.

FIG. 1 is a layout diagram illustrating a semiconductor device according to some exemplary embodiments of the present disclosure. FIG. 2 is a cross-sectional view taken along line A-A' of FIG. 1. FIG. 3 is an enlarged cross-sectional view of portion K of FIG. 2. FIG. 4 is a cross-sectional view taken along line B-B' of FIG. 1. FIG. 5 is a graph for illustrating an off-current of the semiconductor device of FIG. 1.

Referring to FIGS. 1 to 4, a semiconductor device according to some exemplary embodiments of the present disclosure includes first to fourth bottom word lines BWL1 to BWL4, first to fourth top word lines TWL1 to TWL4, first to fourth bit lines BL1 to BL4, first to eighth lower memory cells LC1 to LC8, first to eighth upper memory cells UC1 to UC8, and first to fifth mold layers 10, 15, 30, 35 and 50, etc. It is to be noted that the number of each of the elements is merely an example, and is not limited to the above-mentioned number.

The first to fourth bottom word lines BWL1 to BWL4 may extend in parallel in a first direction X. The first to fourth bottom word lines BWL1 to BWL4 may be spaced apart along a second direction Y. The first direction X may intersect the second direction Y. For example, the first direction X may be orthogonal to the second direction Y.

The first to fourth bottom word lines BWL1 to BWL4 may be formed in parallel at the same level. More specifically, the second bottom word line BWL2 may be located between the first bottom word line BWL1 and the third bottom word line BWL3, and the third bottom word line BWL3 may be located between the second bottom word line BWL2 and the fourth bottom word line BWL4. The first to fourth bottom word lines BWL1 to BWL4 may include conductors. For example, the first to fourth bottom word lines BWL1 to BWL4 may include a metal, such as tungsten.

The first to fourth top word lines BWL1 to BWL4 may extend in parallel in the first direction X. The first to fourth top word lines TWL1 to TWL4 may be spaced apart along the second direction Y. The first to fourth top word lines TWL1 to TWL4 may be formed in parallel at the same level. More specifically, the second top word line TWL2 may be located between the first top word line TWL1 and the third top word line TWL3, and the third top word line TWL3 may be located between the second top word line TWL2 and the fourth top word line TWL4.

The first to fourth top word lines TWL1 to TWL4 may be formed at a higher level than the first to fourth bottom word lines BWL1 to BWL4. The first to fourth top word lines TWL1 to TWL4 may be spaced apart from the first to fourth bottom word lines BWL1 to BWL4 in the third direction Z. The third direction Z may intersect both the first direction X and the second direction Y. The third direction Z may intersect both of the first direction X and the second direction Y.

The first to fourth top word lines TWL1 to TWL4 may be spaced apart from the first to fourth bottom word lines BWL1 to BWL4 in the third direction Z. As shown in FIG. 1, the first to fourth top word lines TWL1 to TWL4 may completely overlap with the first to fourth bottom word lines BWL1 to BWL4 in the third direction Z.

The first to fourth top word lines TWL1 to TWL4 may include conductors. For example, the first to fourth top word lines TWL1 to TWL4 may include a metal, such as tungsten.

The first to fourth bit lines BL1 to BL4 may be formed between the first to fourth bottom word lines BWL1 to BWL4 and the first to fourth top word lines TWL1 to TWL4. The first to fourth bit lines BL1 to BL4 may extend in parallel in the second direction Y. The first to fourth bit lines BL1 to BL4 may be spaced apart from one another in the first direction X. Accordingly, the first to fourth bottom word lines BWL1 to BWL4 and the first to fourth top word lines TWL1 to TWL4 and the first to fourth bit lines BL1 to BL4 may form a mesh structure when viewed from the top.

Specifically, the second bit line BL2 is located between the first bit line BL1 and the third bit line BL3, and the third bit line BL3 may be located between the second bit line BL2 and the fourth bit line BL4. The first to fourth bit lines BL1 to BL4 may be formed at a position such that they are orthogonal to the first to fourth bottom word lines BWL1 to BWL4 and the first to fourth top word lines TWL1 to TWL4.

The first to fourth bit lines BL1 to BL4 may include conductors. For example, the first to fourth bit lines BL1 to BL4 may include a metal, such as tungsten. Each of the first to eighth lower memory cells LC1 to LC8 may be in contact with one of the first to fourth bottom word lines BWL1 to BWL4 and two of the first to fourth bit lines BL1 to BL4. Specifically, the lower surface of the first lower memory cell LC1 may be in contact with the third bottom word line BWL3, and the upper surface of the first lower memory cell LC1 may be in contact with the first bit line BL1 and the second bit line BL2.

The first lower memory cell LC1 may include a 1a lower memory cell LC1a and a 1b lower memory cell LC1b. Specifically, the lower surface of the 1a memory cell LC1a may be in contact with the third bottom word line BWL3, and the upper surface thereof may be in contact with the first bit line BL1. The lower surface of the 1b lower memory cell LC1b may be in contact with the third bottom word line BWL3, and the upper surface thereof may be in contact with the second bit line BL2.

Likewise, the lower surface of the second lower memory cell LC2 may be in contact with the third bottom word line BWL3, and the upper surface of the second lower memory cell LC2 may be in contact with the third bit line BL3 and the fourth bit line BL4. Specifically, the lower surface of the third lower memory cell LC3 may be in contact with the fourth bottom word line BWL4, and the upper surface of the third lower memory cell LC3 may be in contact with the first bit line BL1 and the second bit line BL2. The lower surface of the fourth lower memory cell LC4 may be in contact with the fourth bottom word line BWL4, and the upper surface of the fourth lower memory cell LC4 may be in contact with the third bit line BL3 and the fourth bit line BL4.

The second lower memory cell LC2 may include a 2a lower memory cell LC2a and a 2b lower memory cell LC2b. Specifically, the lower surface of the 2a memory cell LC2a may be in contact with the third bottom word line BWL3, and the upper surface thereof may be in contact with the third bit line BL3. The lower surface of the 2b lower memory cell LC2b may be in contact with the third bottom word line BWL3, and the upper surface thereof may be in contact with the fourth bit line BL4.

The third lower memory cell LC3 may include a 3a lower memory cell LC3a and a 3b lower memory cell LC3b. Specifically, the lower surface of the 3a memory cell LC3a may be in contact with the fourth bottom word line BWL4, and the upper surface thereof may be in contact with the first bit line BL1. The lower surface of the 3b lower memory cell LC3b may be in contact with the fourth bottom word line BWL4, and the upper surface thereof may be in contact with the second bit line BL2.

The fourth lower memory cell LC4 may include a 4a lower memory cell LC4a and a 4b lower memory cell LC4b. Specifically, the lower surface of the 4a memory cell LC4a may be in contact with the fourth bottom word line BWL4, and the upper surface thereof may be in contact with the third bit line BL3. The lower surface of the 4b lower memory cell LC4b may be in contact with the fourth bottom word line BWL3, and the upper surface thereof may be in contact with the fourth bit line BL4.

Additionally, the lower surface of the fifth lower memory cell LC5 may be in contact with the second bottom word line BWL2, and the upper surface of the fifth lower memory cell LC5 may be in contact with the first bit line BL1 and the second bit line BL2. The lower surface of the sixth lower memory cell LC6 may be in contact with the second bottom word line BWL2, and the upper surface of the sixth lower memory cell LC6 may be in contact with the third bit line BL3 and the fourth bit line BL4.

The fifth lower memory cell LC5 may include a 5a lower memory cell LC5a and a 5b lower memory cell LC5b. Specifically, the lower surface of the 5a memory cell LC5a may be in contact with the second bottom word line BWL2, and the upper surface thereof may be in contact with the first bit line BL1. The lower surface of the 5b lower memory cell LC5b may be in contact with the second bottom word line BWL2, and the upper surface thereof may be in contact with the second bit line BL2.

The sixth lower memory cell LC6 may include a 6a lower memory cell LC6a and a 6b lower memory cell LC6b. Specifically, the lower surface of the 6a memory cell LC6a may be in contact with the second bottom word line BWL2, and the upper surface thereof may be in contact with the third bit line BL3. The lower surface of the 6b lower memory cell LC6b may be in contact with the second bottom word line BWL2, and the upper surface thereof may be in contact with the fourth bit line BL4.

The lower surface of the seventh lower memory cell LC7 may be in contact with the first bottom word line BWL1, and the upper surface of the seventh lower memory cell LC7 may be in contact with the first bit line BL1 and the second bit line BL2. The lower surface of the eighth lower memory cell LC8 may be in contact with the first bottom word line BWL1, and the upper surface of the eighth lower memory cell LC8 may be in contact with the third bit line BL3 and the fourth bit line BL4.

The seventh lower memory cell LC7 may include a 7a lower memory cell LC7a and a 7b lower memory cell LC7b. Specifically, the lower surface of the 7a memory cell LC7a may be in contact with the first bottom word line BWL1, and the upper surface thereof may be in contact with the first bit line BL1. The lower surface of the 7b lower memory cell LC7b may be in contact with the first bottom word line BWL1, and the upper surface thereof may be in contact with the second bit line BL2.

The eighth lower memory cell LC8 may include a 8a lower memory cell LC8a and a 8b lower memory cell LC8b. Specifically, the lower surface of the 8a memory cell LC8a may be in contact with the first bottom word line BWL1, and the upper surface thereof may be in contact with the third bit line BL3. The lower surface of the 8b lower memory cell LC8b may be in contact with the first bottom word line BWL1, and the upper surface thereof may be in contact with the fourth bit line BL4.

Each of the first to eighth upper memory cells UC1 to UC8 may be in contact with one of the first to fourth word lines BL1 to BL4 and two of the first to fourth top word lines TWL1 to TWL4. Specifically, the lower surface of the first upper memory cell UC1 may be in contact with the second bit line BL2, and the upper surface of the first upper memory cell UC1 may be in contact with the third top word line TWL3 and the fourth top word line TWL4. The lower surface of the second upper memory cell UC2 may be in contact with the second bit line BL2, and the upper surface of the second upper memory cell UC2 may be in contact with the first top word line TWL1 and the second top word line TWL2.

The first upper memory cell UC1 may include a 1a upper memory cell UC1a and a 1b lower memory cell UC1b. Specifically, the lower surface of the 1a upper memory cell UC1a may be in contact with the second bit line BL2, and the upper surface thereof may be in contact with the fourth top word line TWL4. The lower surface of the 1b upper memory cell UC1b may be in contact with the second bit line BL2, and the upper surface thereof may be in contact with the third top word line TWL3.

The second upper memory cell UC2 may include a 2a upper memory cell UC2a and a 2b upper memory cell UC2b. Specifically, the lower surface of the 2a upper memory cell UC2a may be in contact with the second bit line BL2, and the upper surface thereof may be in contact with the second top word line TWL2. The lower surface of the 2b upper memory cell UC2b may be in contact with the second bit line BL2, and the upper surface thereof may be in contact with the first top word line TWL1.

Likewise, the lower surface of the third upper memory cell UC3 may be in contact with the first bit line BL1, and the upper surface of the third upper memory cell UC3 may be in contact with the third top word line TWL3 and the fourth top word line TWL4. The lower surface of the fourth upper memory cell UC4 may be in contact with the first bit line BL1, and the upper surface of the fourth upper memory cell UC4 may be in contact with the first top word line TWL1 and the second top word line TWL2.

The third upper memory cell UC3 may include a 3a upper memory cell UC3a and a 3b upper memory cell UC3b. Specifically, the lower surface of the 3a upper memory cell UC3a may be in contact with the first bit line BL1, and the upper surface thereof may be in contact with the fourth top word line TWL4. The lower surface of the 3b upper memory cell UC3b may be in contact with the first bit line BL1, and the upper surface thereof may be in contact with the third top word line TWL3.

The fourth upper memory cell UC4 may include a 4a upper memory cell UC4a and a 4b lower memory cell UC4b. Specifically, the lower surface of the 4a upper memory cell UC4a may be in contact with the first bit line BL1, and the upper surface thereof may be in contact with the second top word line TWL2. The lower surface of the 4b upper memory cell UC4b may be in contact with the first bit line BL1, and the upper surface thereof may be in contact with the first top word line TWL1.

The lower surface of the fifth upper memory cell UC5 may be in contact with the third bit line BL3, and the upper surface of the fifth upper memory cell UC5 may be in contact with the third top word line TWL3 and the fourth top word line TWL4. The lower surface of the sixth upper memory cell UC6 may be in contact with the third bit line BL3, and the upper surface of the sixth upper memory cell UC6 may be in contact with the first top word line TWL1 and the second top word line TWL2.

The fifth upper memory cell UC5 may include a 5a upper memory cell UC5a and a 5b lower memory cell UC5b. Specifically, the lower surface of the 5a upper memory cell UC5a may be in contact with the third bit line BL3, and the upper surface thereof may be in contact with the fourth top word line TWL4. The lower surface of the 5b upper memory cell UC5b may be in contact with the third bit line BL3, and the upper surface thereof may be in contact with the third top word line TWL3.

The sixth upper memory cell UC6 may include a 6a upper memory cell UC6a and a 6b upper memory cell UC6b. Specifically, the lower surface of the 6a upper memory cell UC6a may be in contact with the third bit line BL3, and the upper surface thereof may be in contact with the second top word line TWL2. The lower surface of the 6b upper memory cell UC6b may be in contact with the third bit line BL3, and the upper surface thereof may be in contact with the first top word line TWL1.

The lower surface of the seventh upper memory cell UC7 may be in contact with the fourth bit line BL4, and the upper surface of the seventh upper memory cell UC7 may be in contact with the third top word line TWL3 and the fourth top word line TWL4. The lower surface of the eighth upper memory cell UC8 may be in contact with the fourth bit line BL4, and the upper surface of the eighth upper memory cell UC8 may be in contact with the first top word line TWL1 and the second top word line TWL2.

The seventh upper memory cell UC7 may include a 7a upper memory cell UC7a and a 7b upper memory cell UC7b. Specifically, the lower surface of the 7a upper memory cell UC7a may be in contact with the fourth bit line BL4, and the upper surface thereof may be in contact with the fourth top word line TWL4. The lower surface of the 7b upper memory cell UC7b may be in contact with the first bit line BL4, and the upper surface thereof may be in contact with the third top word line TWL4.

The eighth upper memory cell UC8 may include a 8a upper memory cell UC8a and a 8b upper memory cell UC8b. Specifically, the lower surface of the 8a upper memory cell UC8a may be in contact with the fourth bit line BL4, and the upper surface thereof may be in contact with the second top word line TWL2. The lower surface of the 8b upper memory cell UC8b may be in contact with the fourth bit line BL4, and the upper surface thereof may be in contact with the first top word line TWL1.

Referring to FIGS. 1 to 3, a first lower memory cell LC1 includes a first lower-cell lower-electrode 100, a first lower-cell phase-change layer 110, a first lower-cell intermediate-electrode 120, a first lower-cell lower carbon layer 125, a first lower-cell tunneling oxide layer 127, a first lower-cell OTS (ovonic threshold switch) layer 130, a first lower-cell upper carbon layer 145, and a first lower-cell upper-electrode 140.

The first lower-cell lower-electrode 100 may be formed on the upper surface of the third bottom word line BWL3. The first lower-cell lower-electrode 100 may be in contact with the third bottom word line BWL3. The first lower-cell lower-electrode 100 may be located at the bottom of the first lower memory cell LC1 and thus the lower surface of the first lower-cell lower-electrode 100 may be the bottom of the first lower memory cell LC1. The first lower-cell lower-electrode 100 may be shared by a 1a lower memory cell LC1a and a 1b lower memory cell LC1b.

The first lower-cell lower-electrode 100 may include a conductor. For example, the first lower-cell lower-electrode 100 may include at least one of W, Ti, Al, Cu, C, CN, TiN, TiAlN, TiSiN, TiCN, WN, CoSiN, WSiN, TaN, TaCN and TaSiN. The first lower-cell lower-electrode 100 may apply heat to the first lower-cell phase-change layer 110, like the first lower-cell intermediate-electrode 120 and the first lower-cell upper-electrode 100 to be described later.

Referring to FIG. 3, the first lower-cell lower-electrode 100 may have a dash structure. Specifically, the first lower-cell lower-electrode 100 may include a first portion 100-1 belonging to the 1a lower memory cell LC1a, a second portion 100-2 belonging to the 1b lower memory cell LC1b, and a third portion 100-3 connecting the first portion 100-1 with the second portion 100-2. The first portion 100-1 and the second portion 100-2 may be connected to and extended upward from the both ends of the third portion 100-3 in the first direction X, respectively.

Referring again to FIGS. 1 to 4, the first lower-cell phase-change layer 110 may be located on the first lower-cell lower-electrode 100. The first lower-cell phase-change layer 110 may contain a phase-change material. The first lower-cell phase-change layer 110 may include a variety of kinds of materials including binary compound such as GaSb, InSb, InSe, SbTe and GeTe, ternary compound such as GeSbTe, GeBiTe, GaSeTe, InSbTe, SnSb$_2$Te$_4$ and InSbGe, and quaternary compound such as AgInSbTe, (GeSn)SbTe, GeSb(SeTe) and Te$_{81}$Ge$_{15}$Sb$_2$S$_2$. In addition, the above materials may be doped with nitrogen (N), silicon (Si), carbon (C) or oxygen (O) to improve the semiconductor properties of the first lower-cell phase-change layer 110. For example, GeSbTe doped with nitrogen (N), silicon (Si), carbon (C) or oxygen (O) may be included in the first lower-cell phase-change layer 110.

The first lower-cell phase-change layer 110 may exist in crystalline phase, amorphous phase or melted phase by the heat generated by the first lower-cell lower-electrode 100, the first lower-cell intermediate-electrode 120 and the first lower-cell upper-electrode 140 and may store information according to such phases.

The first lower-cell intermediate-electrode 120 may be formed on the first lower-cell phase-change layer 110. The first lower-cell intermediate-electrode 120 may apply heat to the first lower-cell phase-change layer 110 like the first lower-cell lower-electrode 100 described above and the first lower-cell upper-electrode 140 to be described later.

The first lower-cell intermediate-electrode 120 may include a conductor. For example, the first lower-cell lower-electrode 100 may include at least one of W, Ti, Al, Cu, C, CN, TiN, TiAlN, TiSiN, TiCN, WN, CoSiN, WSiN, TaN, TaCN and TaSiN.

The first lower-cell lower-carbon layer 125 may be formed on the first lower-cell intermediate electrode 120. The first lower-cell lower-carbon layer 125 may improve interfacial characteristics between the first lower-cell intermediate-electrode 120 and the first lower-cell OTS layer 130. The first lower-cell lower-carbon layer 125 may include carbon (C).

The first lower-cell tunneling oxide layer 127 may be formed on the first lower-cell lower carbon layer 125. The first lower-cell tunneling oxide layer 127 can prevent the occurrence of a current when no voltage is applied to the first lower memory cell LC1, i.e., an off-current.

The first lower-cell tunneling oxide layer 127 may block the off-current when no voltage is applied to the first lower memory cell LC1 but may pass the current when a voltage is applied due to the tunneling effect. The effects of blocking off-current by the first lower-cell tunneling oxide layer 127 will be described later in more detail.

Since the first lower-cell tunneling oxide layer 127 uses the tunneling effect, its thickness should not be too large. Accordingly, the thickness of the first lower-cell tunneling oxide layer 127 may range from 5 to 50 Å.

For example, the first lower-cell tunneling oxide layer 127 may include at least one of SiO$_2$, AlOx, TiOx, TaOx, and HfOx. The first lower-cell tunneling oxide layer 127 may have an etch selectivity with respect to the first to fifth mold layers 10, 15, 30, 35, and 50.

The first lower-cell tunneling oxide layer 127 may have a band gap of 5 eV or more to block off-current.

The first lower-cell OTS layer 130 may be formed on the first lower-cell tunneling oxide layer 127. The first lower-cell OTS layer 130 may contain a chalcogenide. The first lower-cell OTS layer 130 may include at least one of Si, Ge, As, Te and S. However, exemplary embodiments of the present disclosure are not limited thereto.

The first lower-cell OTS layer 130 may change the state of the first lower-cell phase-change layer 110 between amorphous state (when it is turned on) and crystalline state (when it is turned off). The first lower-cell OTS layer 130 may change the state of the first lower-cell phase-change layer 110 according to the voltage applied to the first lower-cell phase-change layer 110. Therefore, it can work as a switch of the memory.

The first lower-cell OTS layer 130 may switch the states of the first lower-cell phase-change layer 110 based on whether the current passing through the first lower-cell OTS layer 130 exceeds the threshold current, or whether the voltage across the first lower-cell OTS layer 130 exceeds the threshold voltage.

The first lower-cell upper carbon layer 145 may be formed on the first lower-cell OTS layer 130. The first lower-cell lower-carbon layer 125 may improve interfacial characteristics between the first lower-cell upper-electrode 140 and the first lower-cell OTS layer 130. The first lower-cell upper-carbon layer 145 may include carbon (C).

The first lower-cell upper-electrode 140 may be formed on the first lower-cell upper carbon layer 145. The first lower-cell intermediate-electrode 120 may apply heat to the first lower-cell phase-change layer 110, like the first lower-cell lower-electrode 100 and the first lower-cell intermediate-electrode 140.

In semiconductor devices according to some exemplary embodiments of the present disclosure, the first lower-cell memory cell LC1 may include the first lower-cell lower-electrode 100 and the first lower-cell upper-electrode 140 without the first lower-cell intermediate-electrode 120. By adding the first lower-cell intermediate-electrode 120, the efficiency of heating can be further increased, and the operation of the memory can become faster.

The second lower-cell lower-electrode 200 may be formed on the upper surface of the third bottom word line BWL3. The second lower memory cell LC2 may have the same structure as the first lower memory cell LC1. The first lower-cell lower-electrode 100, the first lower-cell phase-change layer 110, the first lower-cell intermediate-electrode 120, the first lower-cell lower carbon layer 125, the first lower-cell tunneling oxide layer 127, the first lower-cell OTS layer 130, the first lower-cell upper carbon layer 145 and the first lower-cell upper-electrode 140 may correspond to a second lower-cell lower-electrode 200, a second lower-cell phase-change layer 210, a second lower-cell intermediate-electrode 220, a second lower-cell lower carbon layer 225, a second lower-cell tunneling oxide layer 227, a second lower-cell OTS layer 230, a second lower-cell upper carbon layer 245 and a second lower-cell upper-electrode 240, respectively.

Although not shown in the drawings, the third to eighth lower memory cells LC3 to LC8 material the same structure as the first lower memory cell LC1. The third to eighth lower memory cells LC3 to LC8 may include third to eighth lower-cell lower-electrodes 300 to 800, third to eighth lower-cell phase-change layers 310 to 810, third to eighth lower-cell intermediate-electrodes 320 to 820, third to eighth lower-cell lower carbon layers 325 to 825, third to eighth lower-cell tunneling oxide layers 327 to 827, third to eighth lower-cell upper carbon layers 345 to 845, and third to eighth lower-cell upper-electrodes 340 to 840, respectively.

The first lower-cell phase-change layer 110, the first lower-cell intermediate-electrode 120, the first lower-cell lower carbon layer 125, the first lower-cell tunneling oxide layer 127, the first lower-cell OTS layer 130, the first lower-cell upper carbon layer 145 and the first lower-cell upper-electrode 140 all may have the same width in the first direction X. This is because the first lower-cell phase-change layer 110, the first lower-cell intermediate-electrode 120, the first lower-cell lower carbon layer 125, the first lower-cell tunneling oxide layer 127, the first lower-cell OTS layer 130, the first lower-cell upper carbon layer 145 and the first lower-cell upper-electrode 140 all patterned via a single process. Such characteristics may be equally applied the second to eighth lower memory cell LC2 to LC8.

Each of the first to eighth lower memory cells LC1 to LC8 may have a high aspect ratio. For example, the aspect ratio of each of the first to eighth lower memory cells LC1 to LC8 may range from 5 to 20. It is, however, to be understood that the present disclosure is not limited thereto.

The first to fourth bottom word lines BWL1 to BWL4, the first to fourth top word lines TWL1 to TWL4, the first to fourth bit lines BL1 to BL4, the first to eighth lower memory cells LC1 to LC8 and the first to eighth upper memory cells UC1 to UC8 may be covered by the first to fifth mold layers 10, 15, 30, 35 and 50 and the first to fourth capping layers C1 to C4.

The first to fifth mold layers 10, 15, 30, 35 and 50 may be at least one of SiN, SiON, SiCN, and SiBN.

In semiconductor devices according to some exemplary embodiments of the present disclosure, the first to eighth lower-cell lower-electrodes 100 to 800 may be in direct contact with the first mold layer 10 without any spacer. When the first mold layer 10 is made of SiN, no oxidation occurs on the interface even by the heat due to heating of the first to eighth lower-cell lower-electrodes 100 to 800, so that the thermal durability of the semiconductor device can be improved.

The second mold layer 15 may surround the side surfaces of the first to eighth lower memory cells LC1 to LC8. Specifically, the second mold layer 15 may surround the side surfaces of the 1a to 8a lower memory cells LC1a to LC8a and the 1b to 8b lower memory cells LC1b to LC8b. The second mold layer 20 may be formed on the first mold layer 15.

The second mold layer 15 may surround the side surfaces of the 1a to 8a lower memory cells LC1a to LC8a and the 1b to 8b lower memory cells LC1b to LC8b but may not surround the side surfaces of the first to eighth lower-cell lower electrodes 100 to 800. Instead, the side surfaces of the first to eighth lower-cell lower-electrodes 100 to 800 may be surrounded by the first mold layer 10.

The second mold layer 15 may surround the side surfaces of the first lower-cell phase-change layer 110, the first lower-cell intermediate-electrode 120, the first lower-cell lower carbon layer 125, the first lower-cell tunneling oxide layer 127, the first lower-cell OTS layer 130, the first lower-cell upper carbon layer 145 and the first lower-cell upper-electrode 140. Such characteristics may be equally applied the second to eighth lower memory cell LC2 to LC8.

Referring again to FIGS. 1 to 4, the second mold layer 15 may be used to fill the space between every two of the first to eighth lower memory cells LC1 to LC8.

The height of the upper surface of the second mold layer 15 may be equal to the height of the upper surfaces of the first to eighth lower memory cells LC1 to LC8, i.e., the heights of the upper surfaces of the first to eighth lower-cell upper-electrodes 140.

The first upper-cell lower-electrode 150 may be formed on the upper surface of the second bit line BL2. The first upper memory cell UC1 may have the same structure as the first lower memory cell LC1. The first lower-cell phase-change layer 110, the first lower-cell intermediate-electrode 120, the first lower-cell lower carbon layer 125, the first lower-cell tunneling oxide layer 127, the first lower-cell OTS layer 130, the first lower-cell upper carbon layer 145 and the first lower-cell upper-electrode 140 may correspond to the first upper-cell lower-electrode 150, the first upper-cell phase-change layer 160, the first upper-cell intermediate-electrode 170, the first upper-cell lower carbon layer 175, the first upper-cell tunneling oxide layer 177, the first upper-cell OTS layer 180, the first upper-cell upper carbon layer 195 and the first upper-cell upper-electrode 190, respectively.

Such structural features may be equally applied to the second to eighth upper memory cells UC2 to UC8. The second to eighth upper memory cells UC2 to UC8 may include second to eighth upper-cell lower-electrodes 250 to 850, second to eighth upper-cell phase-change layers 260 to 860, second to eighth upper-cell intermediate-electrodes 270 to 870, second to eighth upper-cell lower carbon layers 275 to 875, second to eighth upper-cell tunneling oxide layers 277 to 877, second to eighth upper-cell OTS layers 280 to 880, second to eighth upper-cell upper carbon layers 295 to 895, and second to eighth upper-cell upper-electrodes 290 to 890, respectively.

Each of the first to eighth upper memory cells UC1 to UC8 may have a high aspect ratio. For example, the aspect ratio of each of the first to eighth upper memory cells UC1 to UC8 may range from 5 to 20. It is, however, to be understood that the present disclosure is not limited thereto.

The direction in which the first to eighth lower memory cells LC1 to LC8 extend is the first direction X, and the direction in which the first to eighth upper memory cells UC1 to UC8 extend is the second direction Y. As used herein, when a memory cell has a rectangular cross section including longer sides and short sides, it may be said that the memory cell is extended along the longer sides.

Therefore, the first to eighth upper memory cells UC1 to UC8 have the same structure as the first to eighth lower memory cells LC1 to LC8, while they may be extended in different directions and may have different vertical levels. Specifically, if the vertical levels of the first to eighth upper memory cells UC1 to UC8 are between the bit line and the top word line, the vertical levels of the first to eighth lower memory cells LC1 to LC8 may be between the bit line and the bottom word line.

In semiconductor devices according to some exemplary embodiments of the present disclosure, the first to eighth upper-cell lower-electrodes 150 to 850 may be in direct contact with the first mold layer 30 without a spacer. When the third mold layer 30 is made of SiN, no oxidation occurs on the interface even by the heat due to heating of the first to eighth upper-cell lower-electrodes 150 to 850, so that the thermal durability of the semiconductor device can be improved.

The fourth mold layer 35 may correspond to the second mold layer 15 described above. The fourth mold layer 35 may surround the side surfaces of the first to eighth upper memory cells UC1 to UC8. Specifically, the fourth mold layer 35 may surround the side surfaces of the 1a to 8a upper memory cells UC1a to UC8a and the 1b to 8b lower memory cells UC1b to UC8b. The fourth mold layer 35 may be formed on the third mold layer 30.

FIG. 5 is a graph showing the current-voltage characteristics when the memory cell includes no tunneling oxide layer (L1) and when the memory cell includes the tunneling oxide layer (L2).

It can be seen from FIG. 5 that the off-current before the threshold switch voltage is larger when the memory cell includes no tunneling oxide layer (L1) than when the memory cell includes the tunneling oxide film (L2).

Accordingly, semiconductor devices according to some exemplary embodiments of the present disclosure can greatly reduce the off-current, thereby significantly improving the reliability as a memory device.

A semiconductor device according to some exemplary embodiments of the present disclosure may employ a diode instead of the OTS layer. Instead of the OTS material, a diode material may replace the role of the switch layer.

In addition, since semiconductor devices according to some exemplary embodiments of the present disclosure uses a phase-change layer, it can be implemented as a phase-change memory, i.e., a phase-change RAM (PRAM). Semiconductor devices according to some exemplary embodiments of the present disclosure may be implemented as a memory with varying resistance, i.e., a resistive RAM (RRAM) by employing another resistive layer instead of the phase-change layer.

Hereinafter, a semiconductor device according to some exemplary embodiments of the present disclosure will be described with reference to FIG. 6. Descriptions of the identical elements described above will be omitted or briefly described to avoid redundancy.

Figure 6:
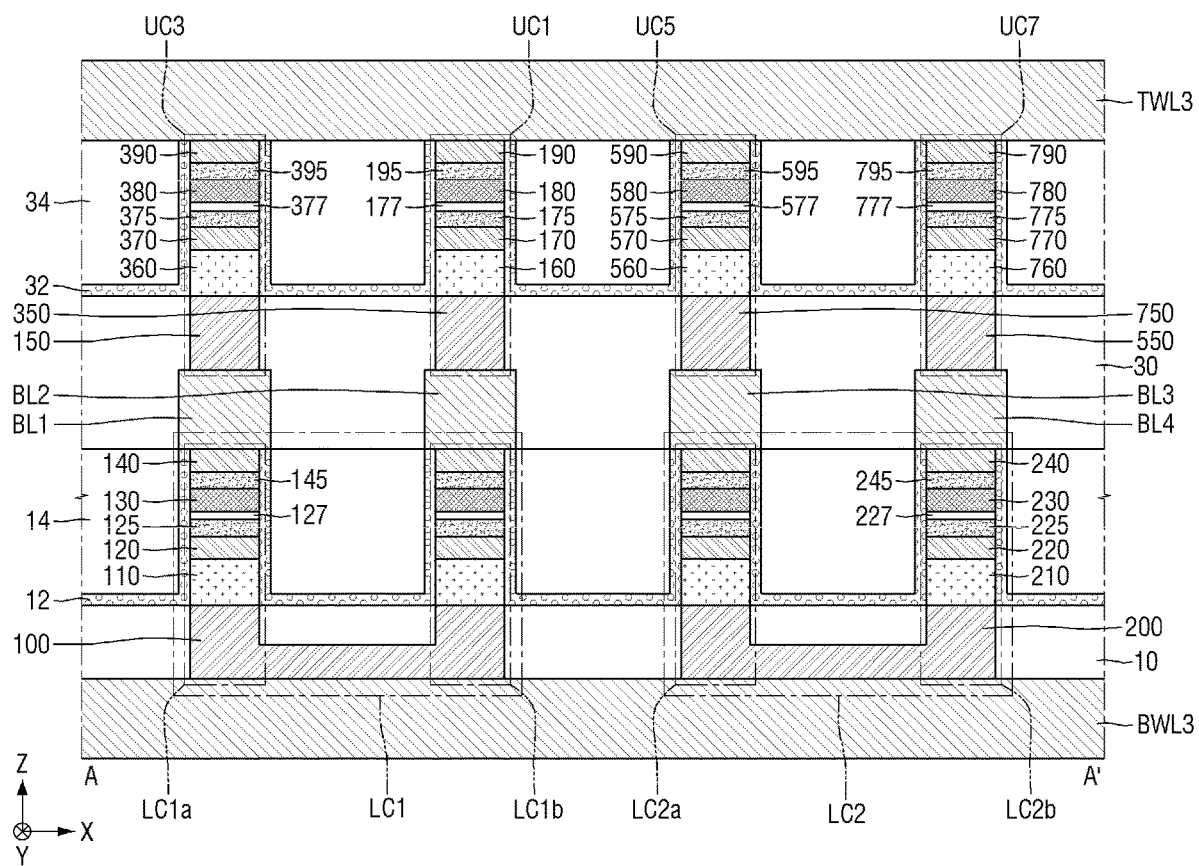
FIG. 6 is a cross-sectional view for illustrating a semiconductor device according to some exemplary embodiments of the present disclosure.

FIG. 6 is a cross-sectional view for illustrating a semiconductor device according to some exemplary embodiments of the present disclosure.

Referring to FIG. 6, a semiconductor device according to some exemplary embodiments of the present disclosure may include a first capping layer 12, a second capping layer 15, a third capping layer 15 and a fourth capping layer 34, instead of the second mold layer 15 and the fourth mold layer 35 of FIG. 2.

The first capping layer 12 may surround the side surfaces of the first to eighth lower memory cells LC1 to LC8. Specifically, the first capping layer 12 may surround the side surfaces of the 1a to 8a lower memory cells LC1a to LC8a and the 1b to 8b lower memory cells LC1b to LC8b. The first capping layer 12 may be formed along the upper surface of the first mold layer 10.

Specifically, referring to FIG. 6, the first capping layer 12 may be formed along the side surfaces of the (1-1)th lower memory cell LC1a, the side surfaces of the (1-2)th second lower memory cell LC1b, and the side surfaces of the first mold layer 10 so that it conforms of the them.

The second capping layer 14 may be formed on the first capping layer 12. The second capping layer 14 may be used to fill the space between every two of the first to eighth lower memory cells LC1 to LC8.

The height of the upper surface of the second capping layer 14 may be equal to the heights of the upper surfaces of the first to eighth lower memory cells LC1 to LC8, i.e., the heights of the upper surfaces of the first to eighth lower-cell upper-electrodes 140.

The first capping layer 12 and the second capping layer 14 may have different properties. The first capping layer 12 may be formed with $N_2$ plasma at a low temperature, and accordingly the volatilization of the OTS element in the memory cell can be suppressed so that the first lower-cell OTS layer 130 can be protected.

However, since the first capping layer 12 is formed at a low temperature, it can have a large wet etching rate (WER) with respect to HF and thus is likely to be damaged during a subsequent etching process. In addition, the first capping layer 12 is formed during a low-temperature process and thus may have poor step coverage. If the space between the memory cells is filled only with the first capping layer 12, an air gap or a seam is likely to be formed. Such an air gap or a seam may cause damage to the OTS element in conjunction with the above-mentioned properties of increasing the wet etching rate to HF. Specifically, during a subsequent etching process, an etch chemical may permeate close to the OTS element along an air gap or a seam. In addition, the wet etching rate of the first capping layer 12 is also high, the OTS element may be exposed and damaged.

Accordingly, in semiconductor devices according to some exemplary embodiments of the present disclosure, the second capping layer 14 may be further formed on the first capping layer 12, thereby overcoming the issue of the damage to the OTS. The second capping layer 14 may be formed using $N_2$ plasma and $NH_3$ plasma in a higher temperature process than that of the first capping layer 12. It is to be noted that the deposition process of the second capping layer 14 may also be performed at a temperature of 130° C. to 400° C. However, the present disclosure is not limited thereto.

In this manner, the second capping layer 14 can have a lower wet etching rate and better step coverage. As the second capping layer 14 has the better step coverage, the periphery of the memory cells can be completely filled without forming any air gap or seam. As a result, it is possible to prevent HF or the like from permeating into the periphery of the OTS layer during a subsequent etching process. Furthermore, since the second capping layer 14 has a lower wet etching rate, it is possible to prevent HF from permeating into the OTS layer through the second capping layer 14. By doing so, semiconductor devices according to some exemplary embodiments of the present disclosure may have a higher reliability.

Each of the first capping layer 12 and the second capping layer 14 may include at least one of SiN, SiON, SiCN and SiBN. In addition, the first capping layer 12 and the second capping layer 14 may include different materials. For example, the first capping layer 12 may be SiON and the second capping layer 14 may be SiN. It is, however, to be understood that this is merely illustrative. The materials of the first capping layer 12 and the second capping layer 14 are not particularly limited as long as they have differences in the step coverage and the wet etching rate described above.

The third capping layer 32 and the fourth capping layer 34 may correspond to the first capping layer 12 and the second capping layer 14 described above, respectively. The third capping layer 32 can protect the OTS layer since it is formed at a lower temperature process as compared with the fourth capping layer 34, but has poor the step coverage and a larger wet etching rate. On the contrary, the fourth capping layer 34 has relatively excellent step coverage and has a smaller wet etching rate, thereby preventing permeation of HF in a subsequent process.

Hereinafter, a semiconductor device according to some exemplary embodiments of the present disclosure will be described with reference to FIGS. 7 to 9. Descriptions of the identical elements described above will be omitted or briefly described to avoid redundancy.

Figure 7:
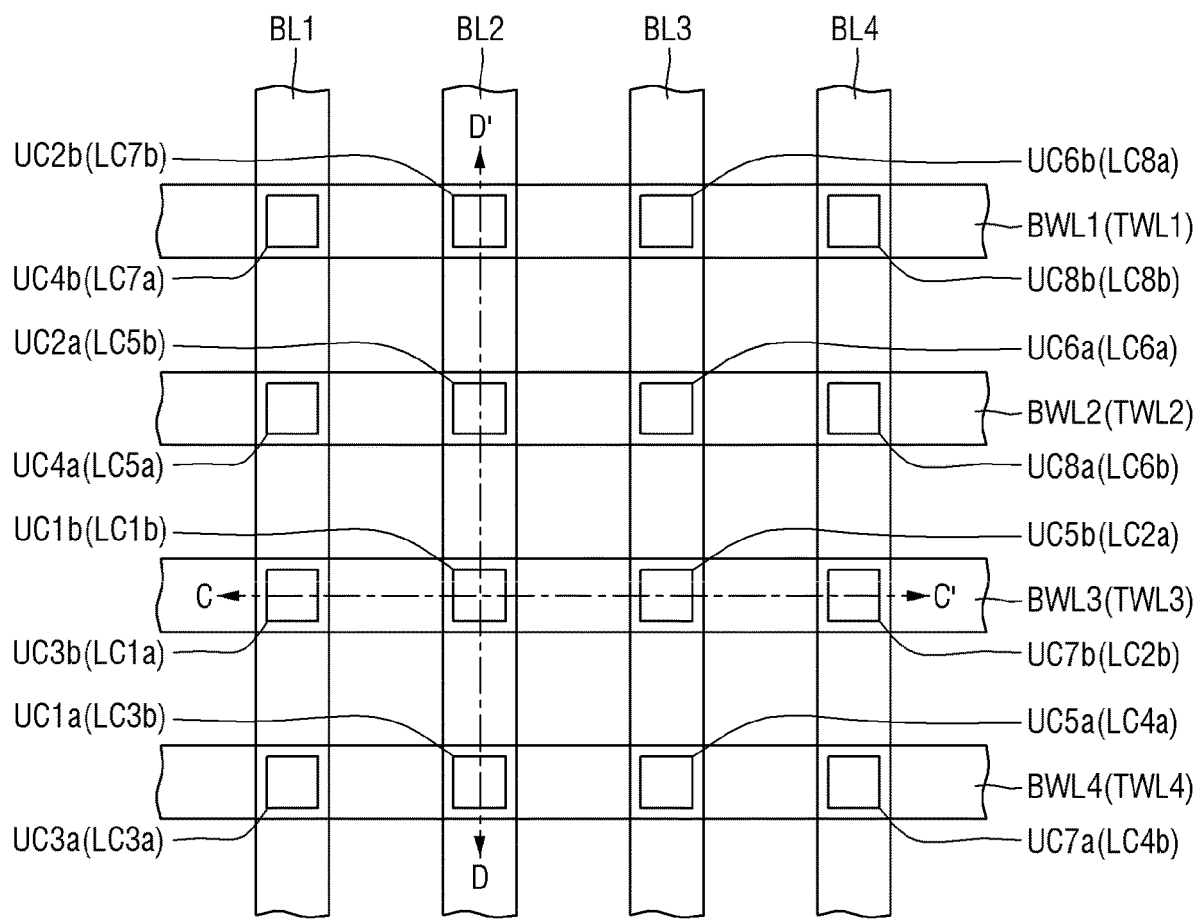
FIG. 7 is a layout diagram for illustrating a semiconductor device according to some exemplary embodiments of the present disclosure.

FIG. 7 is a layout diagram for illustrating a semiconductor device according to some exemplary embodiments of the present disclosure. FIG. 8 is a cross-sectional view taken along line C-C' of FIG. 7. FIG. 9 is a cross-sectional view taken along line D-D' of FIG. 7.

Figure 8:
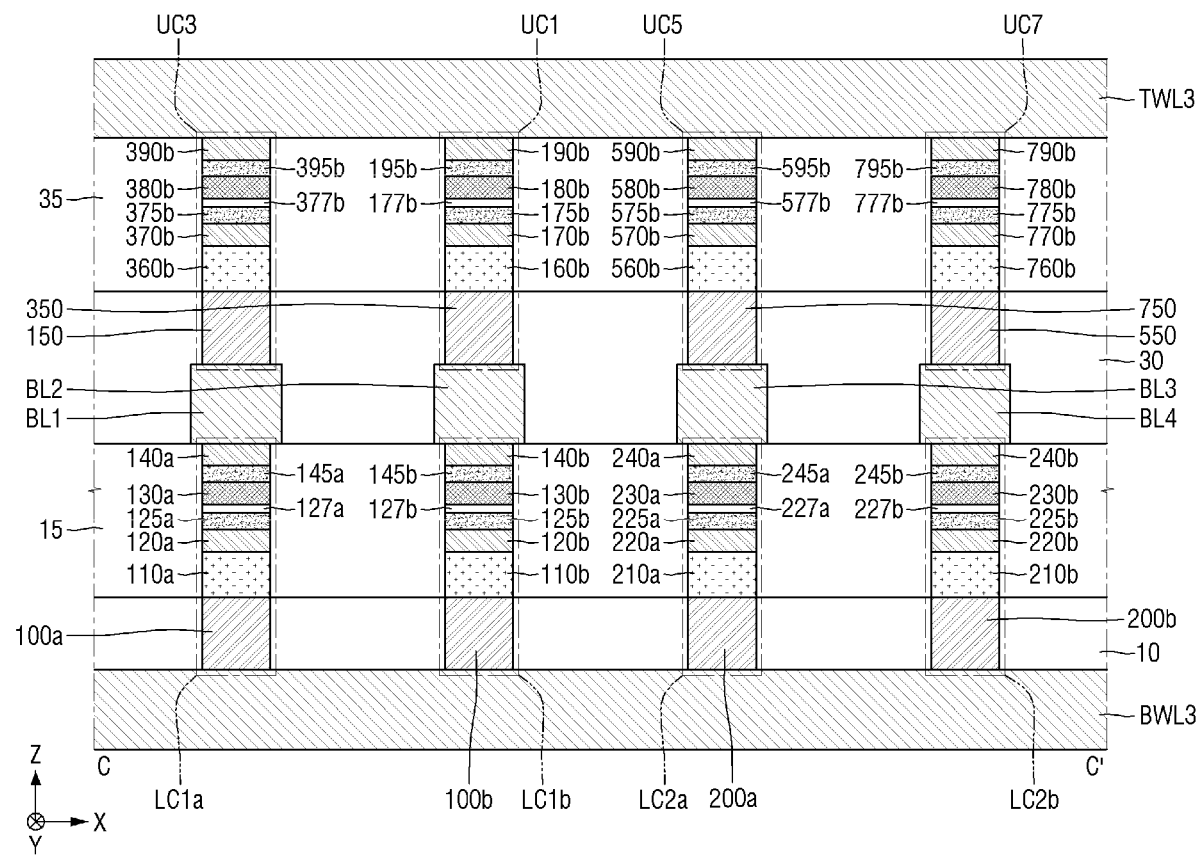
FIG. 8 is a cross-sectional view taken along line C-C' of FIG. 7.
Figure 9:
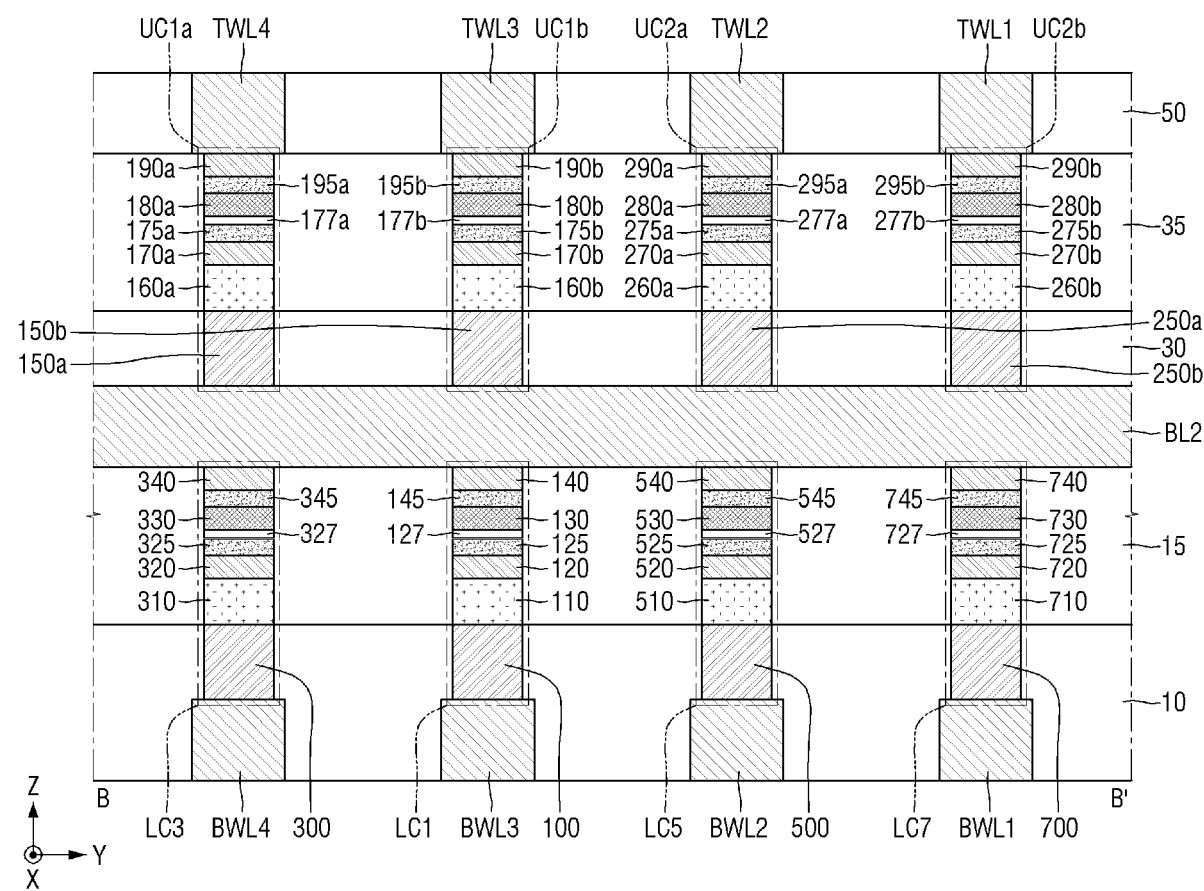
FIG. 9 is a cross-sectional view taken along line D-D' of FIG. 7.

Referring to FIGS. 7 to 9, a semiconductor device according to some exemplary embodiments of the present disclosure may have a bar structure, unlike the first to eighth lower memory cells LC1 to LC8 and the first to eighth upper memory cells UC1 to UC8 of the dash structure according to the exemplary embodiments of FIGS. 1 to 6. Specifically, 1a to 8a lower memory cells LC1a to LC8a and 1b to 8b lower memory cells LC1b to LC8b may be completely separated from one another, and 1a to 8a upper memory cells UC1a to UC8a and the 1b to 8b upper memory cells UC1b to UC8b may be completely separated from one another.

Accordingly, the 1a to 8a lower memory cells LC1a to LC8a may include 1a to 8a lower-cell phase-change layers 110a to 810a, 1a to 8a lower-cell intermediate-electrodes 120a to 820a, 1a to 8a lower-cell lower carbon layers 125a to 825a, 1a to 8a lower-cell tunneling oxide layers 127a to 827a, 1a to 8a lower-cell OTS layers 130a to 830a, 1a to 8a lower-cell upper carbon layers 145a to 845a, 1a to 8a lower-cell upper-electrodes 140a to 840a, respectively.

Additionally, the 1b to 8b lower memory cells LC1b to LC8b may include 1b to 8b lower-cell phase-change layers 110b to 810b, 1b to 8b lower-cell intermediate-electrodes 120b to 820b, 1b to 8b lower-cell carbon layers 125b to 825b, 1b to 8b lower-cell tunneling oxide layers 127b to 827b, 1b to 8b lower-cell OTS layers 130b to 830b, 1b to 8b lower-cell upper carbon layers 145b to 845b, 1b to 8b lower-cell upper-electrodes 140b to 840b, respectively.

Accordingly, the 1a to 8a upper memory cells UC1a to UC8a may include 1a to 8a upper-cell phase-change layers 160a to 860a, 1a to 8a upper-cell intermediate-electrodes 170a to 870a, 1a to 8a upper-cell lower carbon layers 175a to 875a, 1a to 8a upper-cell tunneling oxide layers 177a to 877a, 1a to 8a upper-cell OTS layers 180a to 880a, 1a to 8a upper-cell upper carbon layers 195a to 895a, and 1a to 8a upper-cell upper-electrodes 190a to 890a, respectively.

Additionally, the 1b to 8b upper memory cells UC1b to UC8b may include 1b to 8b upper-cell phase-change layers 160b to 860b, 1b to 8b upper-cell intermediate-electrodes 170b to 870b, 1b to 8b upper-cell carbon layers 175b to 875b, 1b to 8b upper-cell tunneling oxide layers 177b to 877b, 1b to 8b upper-cell OTS layers 180b to 880b, 1b to 8b upper-cell upper carbon layers 195b to 895b, 1b to 8b upper-cell upper-electrodes 190b to 890b, respectively.

In the dash structure, two stacks are connected together to increase the efficiency of the process. In contrast, in the bar structure according to this exemplary embodiment, the cells are more isolated and accordingly the interference between adjacent cells can be greatly reduced. As a result, the reliability of the semiconductor device can be significantly improved.

Hereinafter, a semiconductor device according to some exemplary embodiments of the present disclosure will be described with reference to FIG. 10. Descriptions of the identical elements described above will be omitted or briefly described to avoid redundancy.

Figure 10:
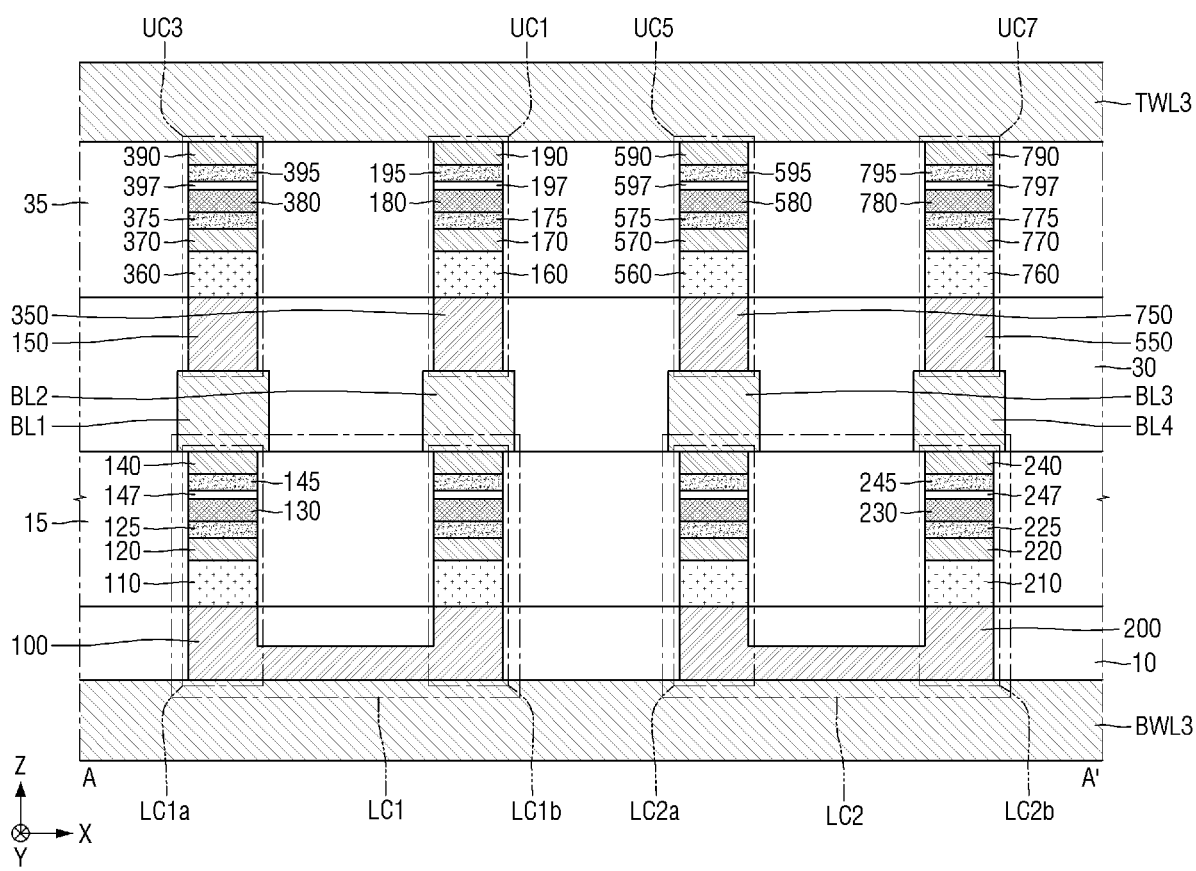
FIG. 10 is a cross-sectional view for illustrating a semiconductor device according to some exemplary embodiments of the present disclosure.

FIG. 10 is a cross-sectional view for illustrating a semiconductor device according to some exemplary embodiments of the present disclosure.

Referring to FIG. 10, in a semiconductor device according to some exemplary embodiments of the present disclosure, a tunneling oxide layer may be formed between the upper carbon layer and the OTS layer in each of the memory cells.

Specifically, in the first lower memory cell LC1 as example, the first lower-cell OTS layer 130 may be formed directly on the first lower-cell lower carbon layer 125, and the first lower-cell tunneling oxide layer 147 may be formed on the first lower-cell OTS layer 130.

The first lower-cell upper carbon layer 145 may be formed on the first lower-cell tunneling oxide layer 147. The position of the tunneling oxide layer is not limited as long as it can block the off-current. For example, it may be located under or on the OTS layer.

Therefore, in semiconductor devices according to this exemplary embodiment, the tunneling oxide layer is disposed on the OTS layer and can block off-current.

Hereinafter, a semiconductor device according to some exemplary embodiments of the present disclosure will be described with reference to FIG. 11. Descriptions of the identical elements described above will be omitted or briefly described to avoid redundancy.

Figure 11:
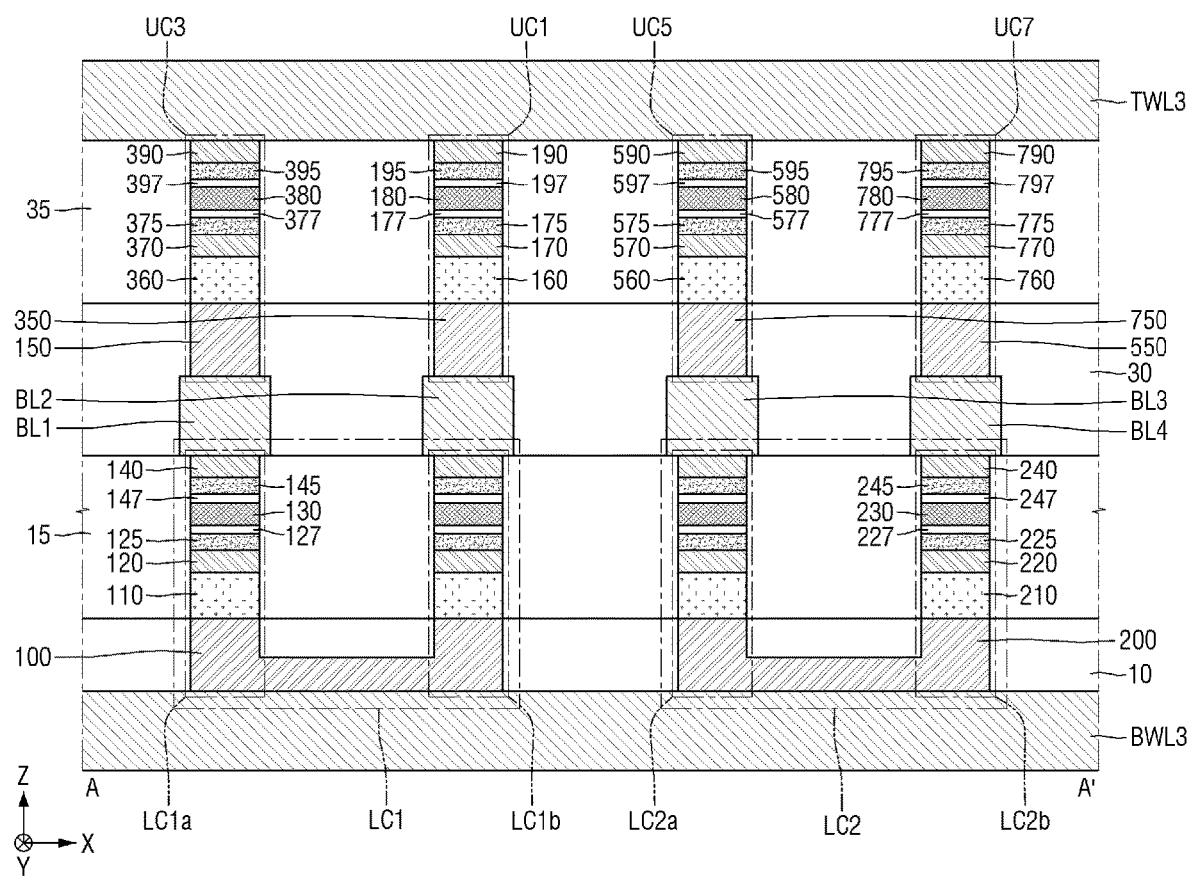
FIG. 11 is a cross-sectional view for illustrating a semiconductor device according to some exemplary embodiments of the present disclosure.

FIG. 11 is a cross-sectional view for illustrating a semiconductor device according to some exemplary embodiments of the present disclosure.

Referring to FIG. 11, in a semiconductor device according to some exemplary embodiments of the present disclosure, a tunneling oxide layer may be formed between the lower carbon layer and the OTS layer as well as between the upper carbon layer and the OTS layer in each of the memory cells.

Specifically, for the first lower memory cell LC1 as example, the first lower-cell tunneling oxide layer 127 may be formed on the first lower-cell lower carbon layer 125, the first lower-cell OTS layer 130 may be formed on the first lower-cell tunneling oxide layer 127, and the first lower-cell tunneling oxide layer 127 may be formed on the first lower-cell OTS layer 130. The first lower-cell upper carbon layer 145 may be formed on the first lower-cell tunneling oxide layer 147.

By doing so, the tunneling oxide layer is formed on and under the OTS layer, such that it is possible to block the off-current more effectively. In addition, in order to utilize the tunneling effect, the tunneling oxide layer should not be too thick. Therefore, in order to block the off-current more effectively, the tunneling oxide films may be disposed on both the upper and lower sides.

Therefore, in semiconductor devices according to some exemplary embodiments of the present disclosure, two tunneling oxide layers block the off-current, so that the reliability can be further improved and the operational performance can be improved.

Hereinafter, a method for fabricating a semiconductor device according to some exemplary embodiments of the present disclosure will be described with reference to FIGS. 1 and 12 to 23. Descriptions of the identical elements described above will be omitted or briefly described to avoid redundancy.

FIGS. 12 to 23 are cross-sectional views for illustrating processing steps of a method for fabricating a semiconductor device according to some exemplary embodiments of the present disclosure.

Figure 12:
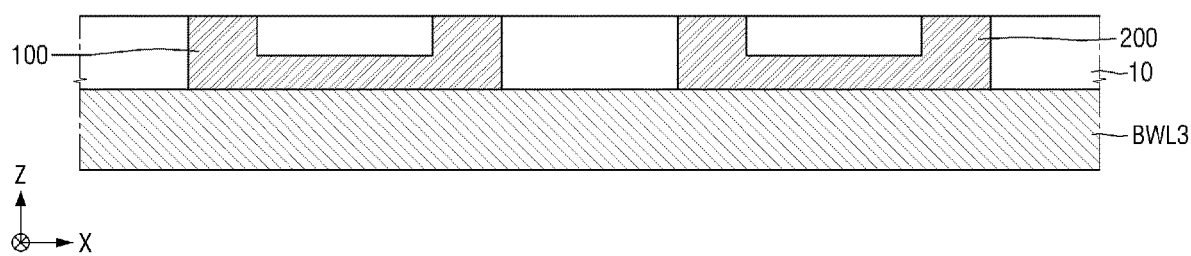
FIGS. 12 to 23 are cross-sectional views for illustrating processing steps of a method for fabricating a semiconductor device according to some exemplary embodiments of the present disclosure.

Referring initially to FIG. 12, a third bottom word line BWL3 extended in the first direction X is formed.

Although no other bottom word lines than the third bottom word line BWL3 are not shown in the drawing, it is to be understood that the first to fourth bottom word lines BWL1 to BWL4 may be formed as well. In the following description, only the cross section taken along line A-A' of FIG. 1 will be described for convenience of illustration.

Subsequently, a first mold layer 10, a first lower-cell lower-electrode 100 and a second lower-cell lower-electrode 200 are formed on the third bottom word line BWL3. The first lower-cell lower-electrode 100 and the second lower-cell lower-electrode 200 may have a U-shaped structure or a dash structure.

For example, the first lower-cell lower-electrode 100 and the second lower-cell lower-electrode 200 may include at least one of W, Ti, Al, Cu, C, CN, TiN, TiAlN, TiSiN, TiCN, WN, CoSiN, WSiN, TaN, TaCN and TaSiN. It is, however, to be understood that this is merely illustrative.

The first mold layer 10 may be formed on the upper surface and the side surfaces of the third bottom word line BWL3. The first mold layer 10 may include one of SiN, SiON, SiCN and SiBN, for example.

Figure 13:
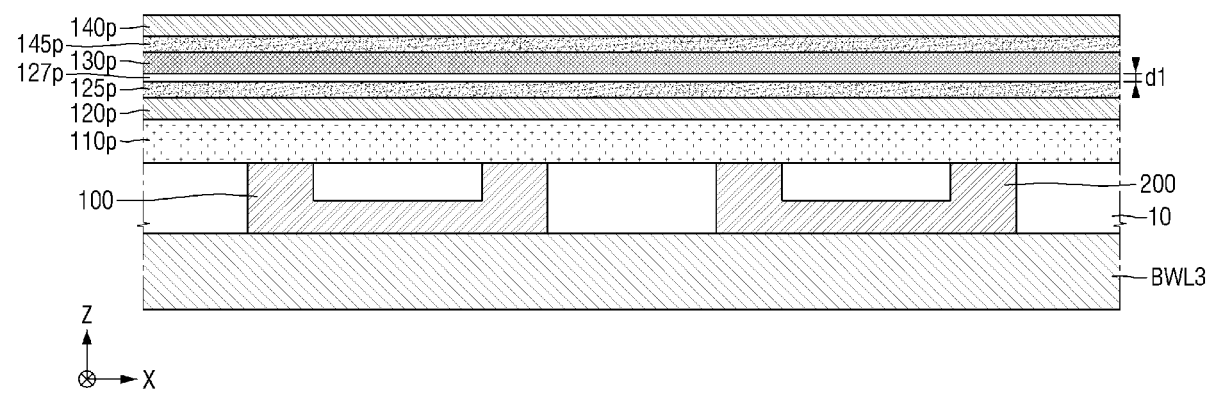

Subsequently, referring to FIG. 13, a lower-cell phase-change layer 110P, a lower-cell intermediate-electrode layer 120P, a lower-cell lower carbon layer 125P, a lower-cell tunneling oxide layer 127P, a lower-cell OTS layer 130P, a lower-cell upper carbon layer 145P and the lower-cell upper electrode layer 140P are sequentially formed.

The lower-cell phase-change layer 110 may contain a phase-change material. The lower-cell phase-change layer 110P may include a variety of kinds of materials including binary compound such as GaSb, InSb, InSe, SbTe and GeTe, ternary compound such as GeSbTe, GeBiTe, GaSeTe, InSbTe, $SnSb_2Te_4$ and InSbGe, and quaternary compound such as AgInSbTe, (GeSn)SbTe, GeSb(SeTe) and $Te_{81}Ge_{15}Sb_2S_2$. In addition, the above materials may be doped with nitrogen (N), silicon (Si), carbon (C) or oxygen (O) to improve the semiconductor properties of the lower-cell phase-change layer 110P. For example, GeSbTe doped with nitrogen (N), silicon (Si), carbon (C) or oxygen (O) may be included in the lower-cell phase-change layer 110P.

The lower-cell intermediate-electrode 120P may include a conductor. For example, the lower-cell intermediate-electrode layer 120P may include at least one of W, Ti, Al, Cu, C, CN, TiN, TiAlN, TiSiN, TiCN, WN, CoSiN, WSiN, TaN, TaCN and TaSiN.

The lower-cell lower carbon layer 125P and the lower-cell upper carbon layer 145P may contain carbon (C).

The lower-cell tunneling oxide layer 127P may include an insulator. For example, the lower-cell tunneling oxide layer 127P may include at least one of $SiO_2$, AlOx, TiOx, TaOx, and HfOx.

The lower-cell tunneling oxide layer 127P may be formed with a first thickness d1. By adjusting the first thickness d1, the threshold switch voltages of the first to eighth lower memory cells LC1 to LC8 can be adjusted.

As the first thickness d1 become larger, the threshold switch voltages of the first to eighth lower memory cells LC1 to LC8 can also become larger. Accordingly, according to the method for fabricating a semiconductor device according to this exemplary embodiment, by adjusting the first thickness d1, the threshold switch voltages of the first to eighth lower memory cells LC1 to LC8 can be adjusted.

The lower-cell OTS layer 130P may contain a chalcogenide. The lower-cell intermediate-electrode layer 140P may include at least one of W, Ti, Al, Cu, C, CN, TiN, TiAlN, TiSiN, TiCN, WN, CoSiN, WSiN, TaN, TaCN and TaSiN.

Figure 14:
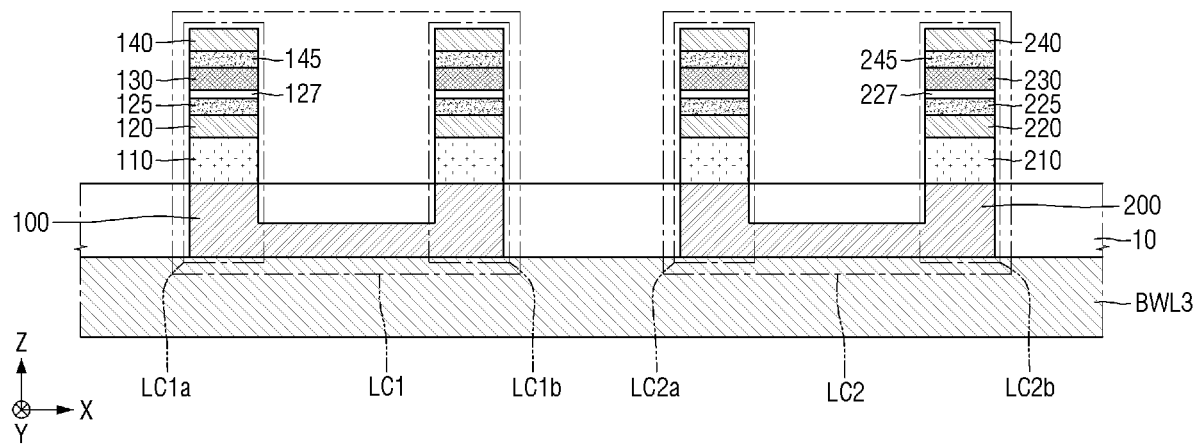

Subsequently, referring to FIG. 14, a lower-cell phase-change layer 110P, a lower-cell intermediate-electrode layer 120P, a lower-cell lower carbon layer 125P, a lower-cell tunneling oxide layer 127P, a lower-cell OTS layer 130P, a lower-cell upper carbon layer 145P and a lower-cell upper electrode layer 140P are patterned, such that the first lower memory cell LC1 and the second lower memory cell LC2 are formed. Although not shown in the drawings, the third to eighth lower memory cells LC3 to LC8 may be formed together.

The first lower memory cell LC1 may include a 1a lower memory cell LC1a and a 1b lower memory cell LC1b, and the second lower memory cell LC2 may include a 2a lower memory cell LC2a and a 2b lower memory cell LC2b.

The lower-cell phase-change layer 110P may be patterned into a first lower-cell phase-change layer 110 and a second lower-cell phase-change layer 210. The lower-cell intermediate electrode layer 120P may be patterned into a first lower-cell intermediate-electrode 120 and a second lower-cell intermediate-electrode 220.

In addition, the lower-cell lower carbon layer 125P may be patterned into a first lower-cell lower carbon layer 125 and a second lower-cell lower carbon layer 225. The lower-cell tunneling oxide layer 127P may be patterned into a first lower-cell tunneling oxide layer 127 and a second lower-cell tunneling oxide layer 227.

In addition, the lower-cell OTS layer 130P may be patterned into a first lower-cell OTS layer 130 and a second lower-cell OTS layer 230. The lower-cell upper carbon layer 145P may be patterned into a first lower-cell upper carbon layer 145 and a second lower-cell upper carbon layer 245. The lower-cell upper electrode layer 140P may be patterned into a first lower-cell upper electrode 140 and a second lower-cell upper electrode 240.

It is to be understood that the above-described method of forming the first lower memory cell LC1 and the second lower memory cell LC2 is equally applied to the third to eighth lower memory cells LC3 to LC8.

Such patterning may be carried out by using the etch selectivity of the lower-cell tunneling oxide layer 127P and other layers with respect to the first mold layer 10. While other layers including the lower-cell tunneling oxide layer 127P are etched, the first mold layer 10 may not be etched.

Figure 15:
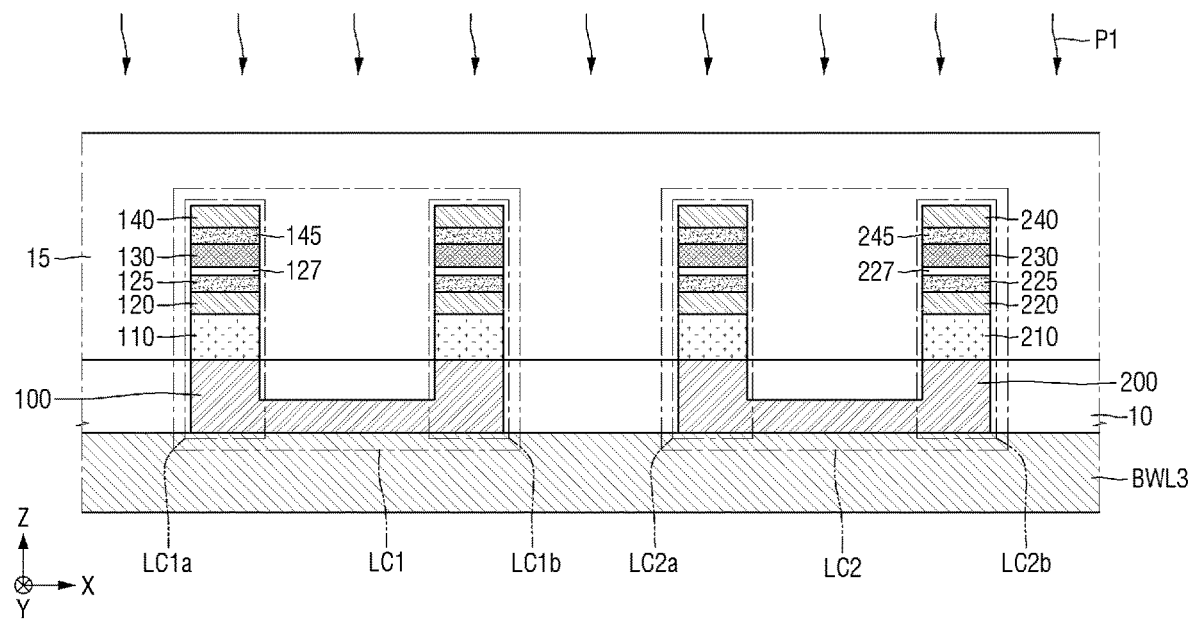

Subsequently, referring to FIG. 15, a second mold layer 15 is formed.

The second mold layer 15 may cover the upper surface and side surfaces of the first to eighth lower memory cells LC1 to LC8 and the upper surface of the first mold layer 10. The second mold layer 15 may be used to gap-fill between the first to eighth lower memory cells LC1 to LC8. The space between the first to eighth lower memory cells LC1 to LC8 can be completely filled with the second mold layer 15.

The second mold layer 15 may be formed with a first plasma P1. The first plasma P1 may be, for example, an $N_2$ plasma and an $NH_3$ plasma.

Figure 16:
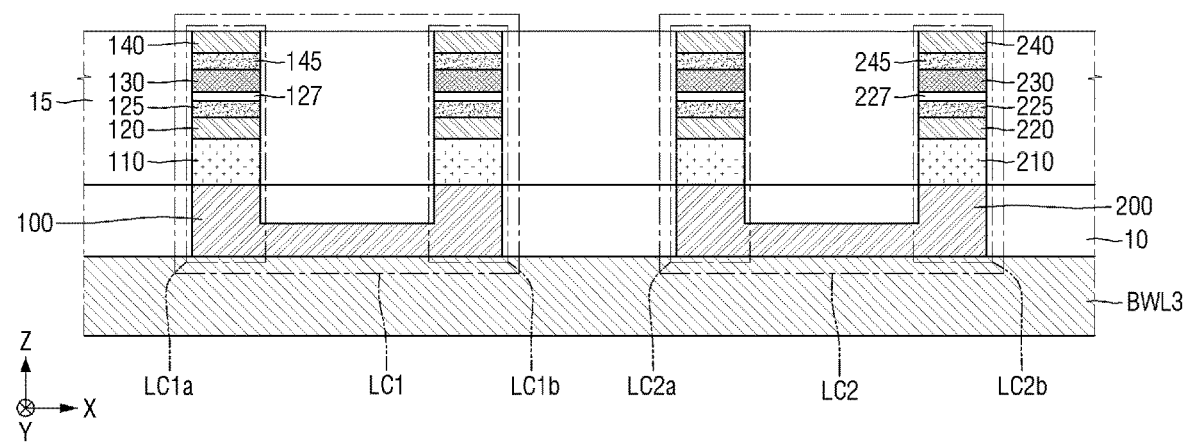

Subsequently, referring to FIG. 16, by removing a part of the second mold layer 15, the upper surfaces of the first lower-cell upper-electrode 140 and the second lower-cell upper-electrode 240.

Figure 17:
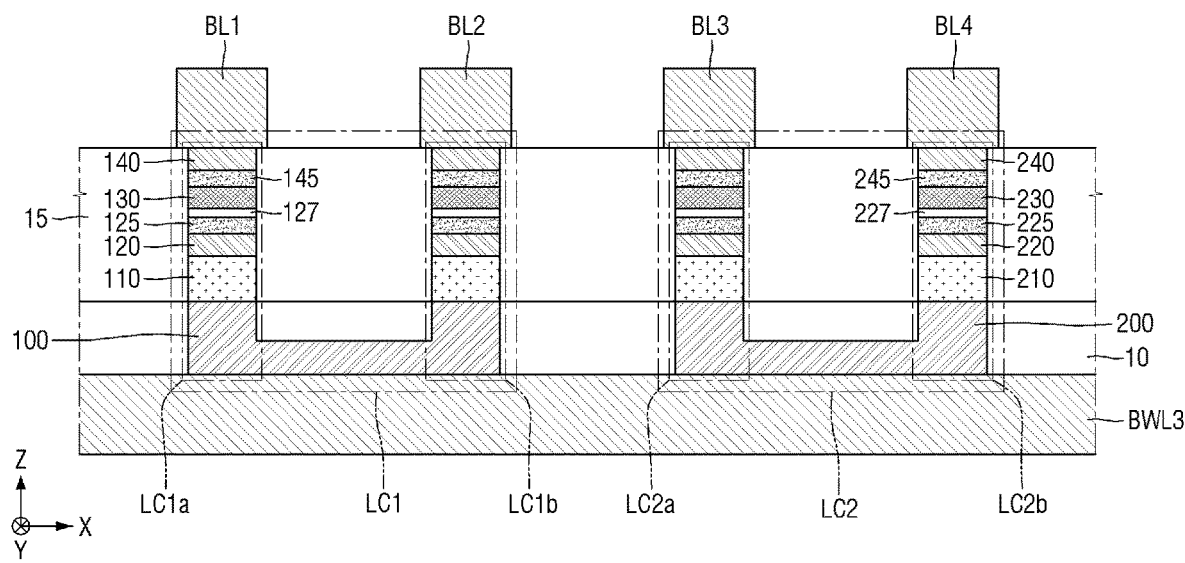

Subsequently, referring to FIG. 17, first to fourth bit lines BL1 to BL4 are formed.

The first to fourth bit lines BL1 to BL4 may be formed at the positions in line with the 1a lower memory cell LC1a, the 1b second lower memory cell LC1b, the 2a lower memory cell LC2a, and a 2b lower memory cell LC2b such that they extend in the second direction Y.

Figure 18:
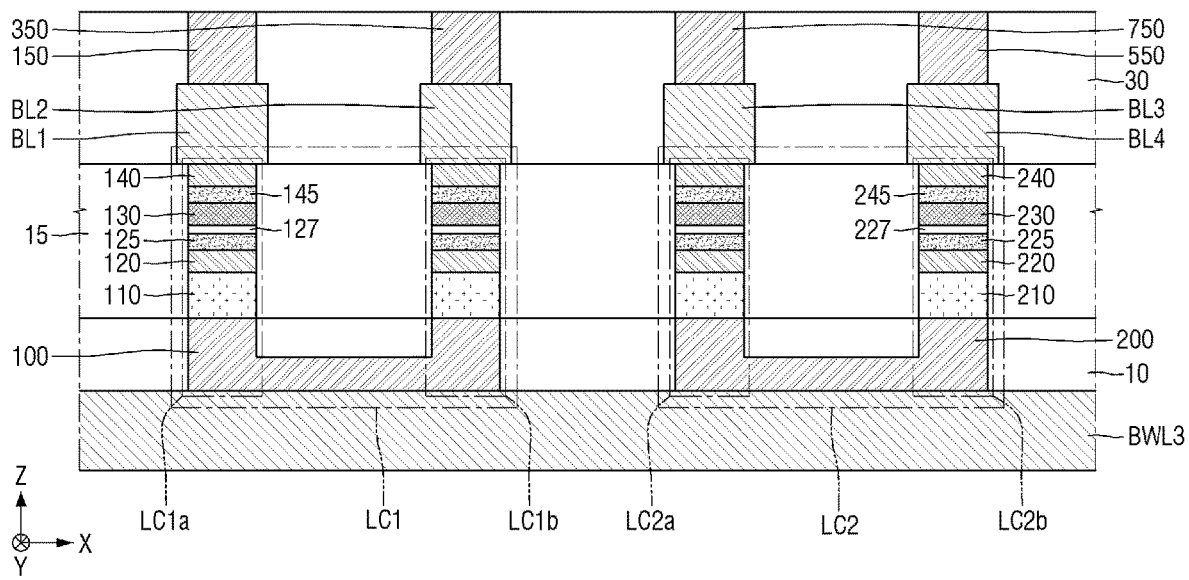

Subsequently, referring to FIG. 18, a first upper-cell lower-electrode 150, a third upper-cell lower-electrode 350, a fifth upper-cell lower-electrode 550, and a seventh upper-cell lower-electrode 750 are formed. It is to be noted that they may be formed in the same manner as the first lower-cell lower electrode 100, but they may be extended in the second direction Y rather than the first direction X.

Figure 19:
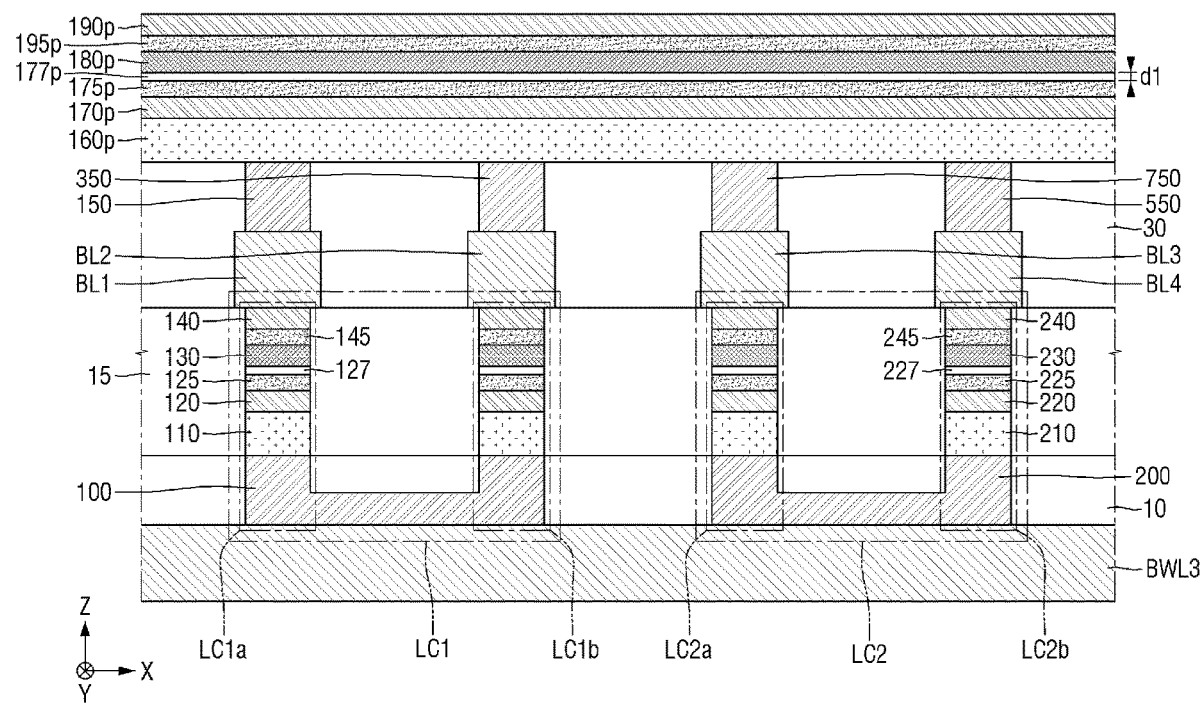

Subsequently, referring to FIG. 19, an upper-cell phase-change layer 160P, an upper-cell intermediate electrode layer 170P, an upper-cell lower carbon layer 175P, an upper-cell tunneling oxide layer 177P, an upper-cell OTS layer 180P, an upper-cell upper carbon layer 195P and an upper-cell upper electrode layer 190P are sequentially formed. The upper-cell phase-change layer 160P may contain a phase-change material. The upper-cell intermediate electrode layer 170P may include a conductor.

The upper-cell lower carbon layer 175P and the upper-cell upper carbon layer 195P may contain carbon (C). The upper-cell tunneling oxide layer 177P may include an insulator. For example, the upper-cell tunneling oxide layer 177P may include at least one of $SiO_2$, AlOx, TiOx, TaOx, and HfOx. The upper-cell tunneling oxide layer 177P may be formed with a first thickness d1. The upper-cell tunneling oxide layer 177P may have the same thickness as the lower-cell tunneling oxide layer 127P. By doing so, uniformity between the upper and lower memory cells can be maintained.

The upper-cell OTS layer 180P may contain a chalcogenide. The upper-cell upper electrode layer 190P may include a conductor.

Figure 20:
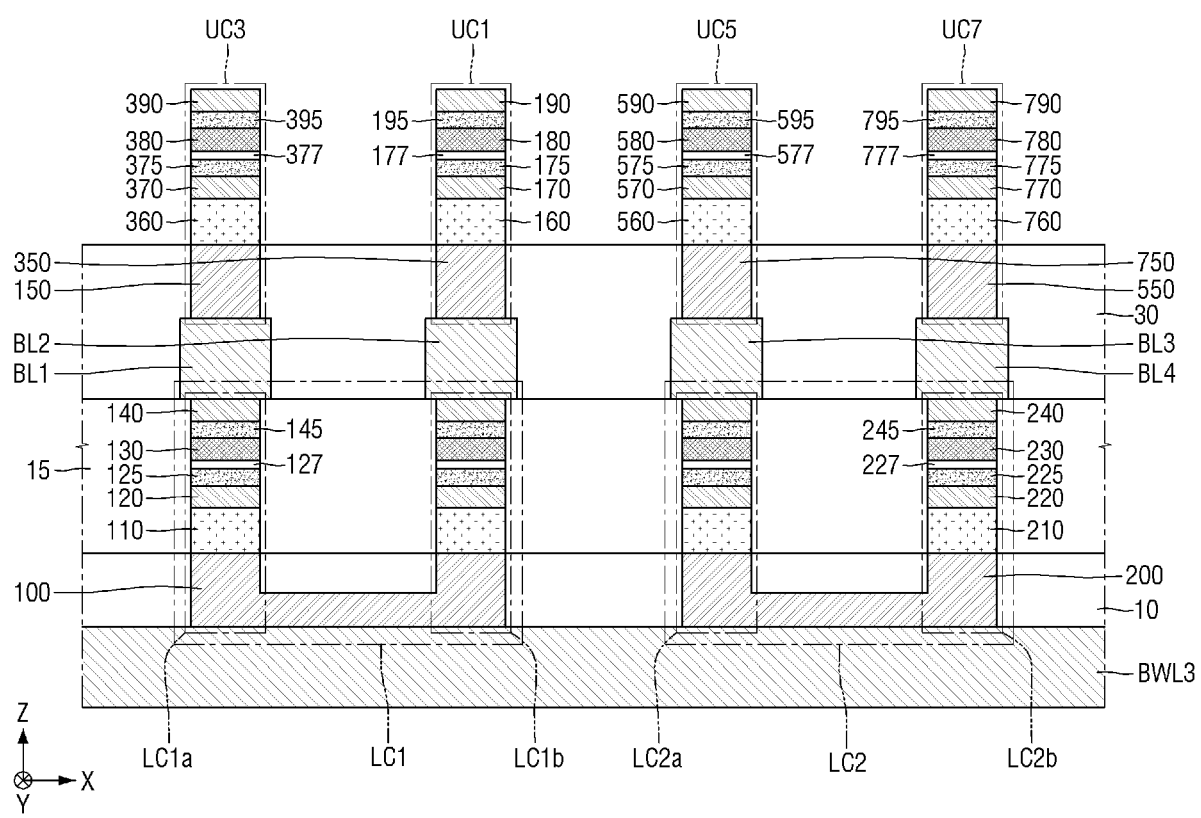
Figure 21:
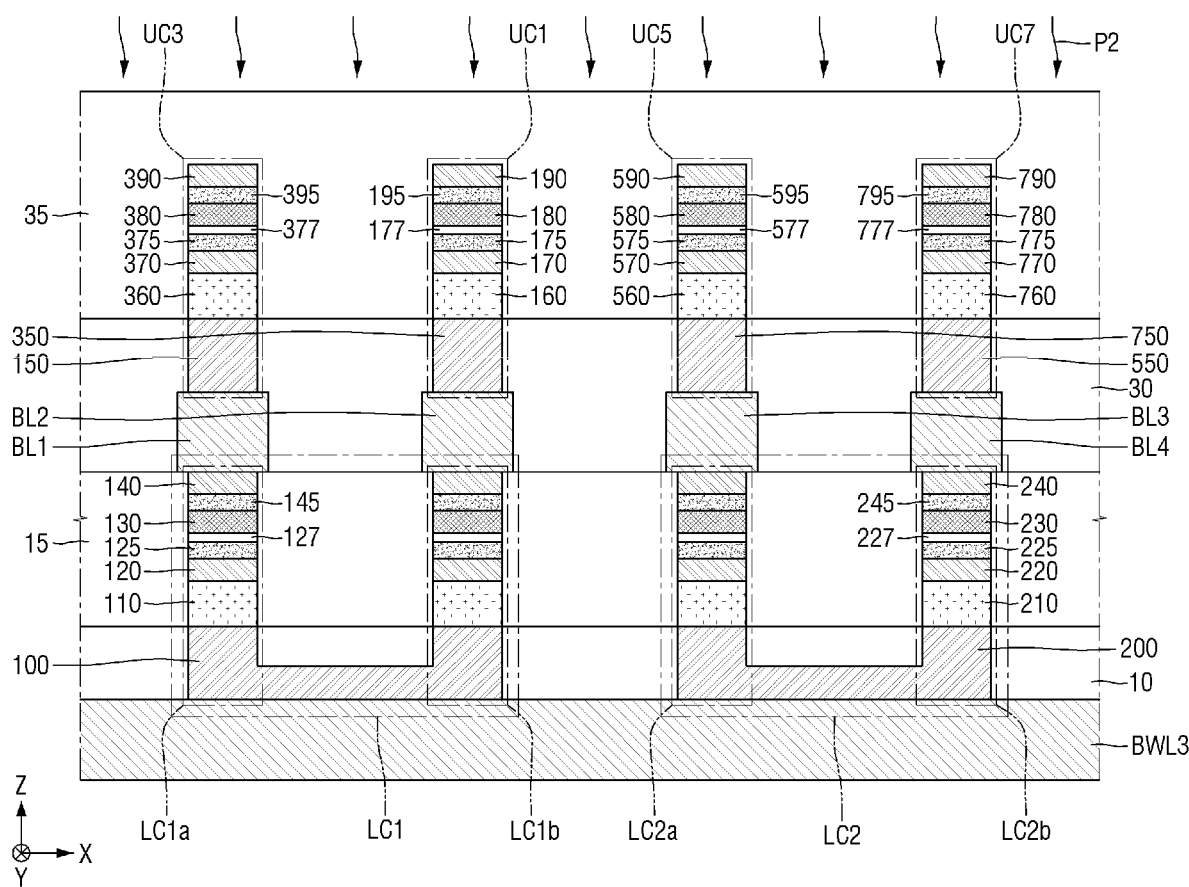

Subsequently, referring to FIG. 20, an upper-cell phase-change layer 160P, an upper-cell intermediate electrode layer 170P, an upper-cell lower carbon layer 175P, an upper-cell tunneling oxide layer 177P, an upper-cell OTS layer 180P, an upper-cell upper carbon layer 195P and an upper-cell upper electrode layer 190P are patterned, such that the first upper memory cell UC1 and the third upper memory cell UC3, and the fifth upper memory cell UC5 and the seventh upper memory cell UC7 are formed. Although not shown in the drawings, the second upper memory cell UC2, the fourth upper memory cell UC4, the sixth upper memory cell UC6 and the eighth upper memory cell UC8 may be formed together.

The upper-cell phase-change layer 160P may be patterned into the first upper-cell phase-change layer 160, the third upper-cell phase-change layer 360, the fifth upper-cell phase-change layer 560 and the seventh upper-cell phase-change layer 760. The upper-cell intermediate electrode layer 170P may be patterned into the first upper-cell intermediate-electrode 170, the third upper-cell intermediate-electrode 370, the fifth upper-cell intermediate-electrode 570 and the seventh upper-cell intermediate-electrode 720.

In addition, the upper-cell lower carbon layer 175P may be patterned into the first upper-cell lower carbon layer 175, the third upper-cell lower carbon layer 375, the fifth upper-cell lower carbon layer 575 and the seventh upper-cell lower carbon layer 775. The upper-cell tunneling oxide layer 177P may be patterned into the first upper-cell tunneling oxide layer 177, the third upper-cell tunneling oxide layer 377, the fifth upper-cell tunneling oxide layer 577 and the seventh upper-cell tunneling oxide layer 777.

In addition, the upper-cell OTS layer 180P may be patterned into the first upper-cell OTS layer 180, the third upper-cell OTS layer 380, the fifth upper-cell OTS layer 580 and the seventh upper-cell OTS layer 780. The upper-cell upper carbon layer 195P may be patterned into the first upper-cell upper carbon layer 195, the third upper-cell upper carbon layer 395, the fifth upper-cell upper carbon layer 595 and the seventh upper-cell upper carbon layer 795.

The upper-cell upper electrode layer 195P may be patterned into the first upper-cell upper electrode 190, the third upper-cell upper electrode 390, the fifth upper-cell upper electrode 590 and the seventh upper-cell upper electrode 790.

It is to be understood that the method of forming the first upper memory cell UC1, the third upper memory cell UC3, the fifth upper memory cell UC5 and the seventh upper memory cell UC7 is equally applied to the second upper memory cell UC2, the fourth upper memory cell UC4, the sixth upper memory cell UC6 and the eighth upper memory cell UC8.

Figure 22:
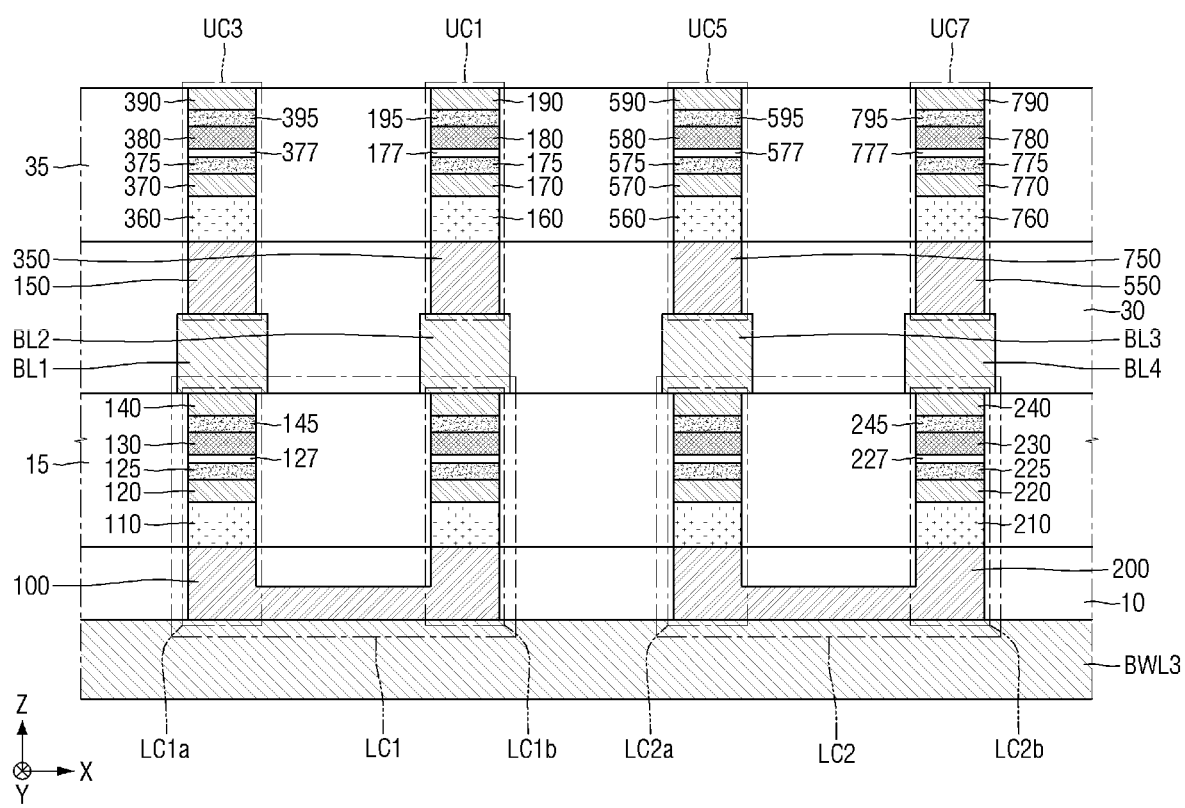

Subsequently, referring to FIG. 22, a fourth mold layer 35 is formed.

The fourth mold layer 35 may be formed with a second plasma P2. The second plasma P2 may be, for example, an $N_2$ plasma and an $NH_3$ plasma.

Subsequently, by removing a part of the fourth mold layer 35, the upper surfaces of the first upper-cell upper-electrode 190, the third upper-cell upper-electrode 390, the fifth upper-cell upper-electrode 590 and the seventh upper-cell upper electrode 790 can be exposed.

Figure 23:
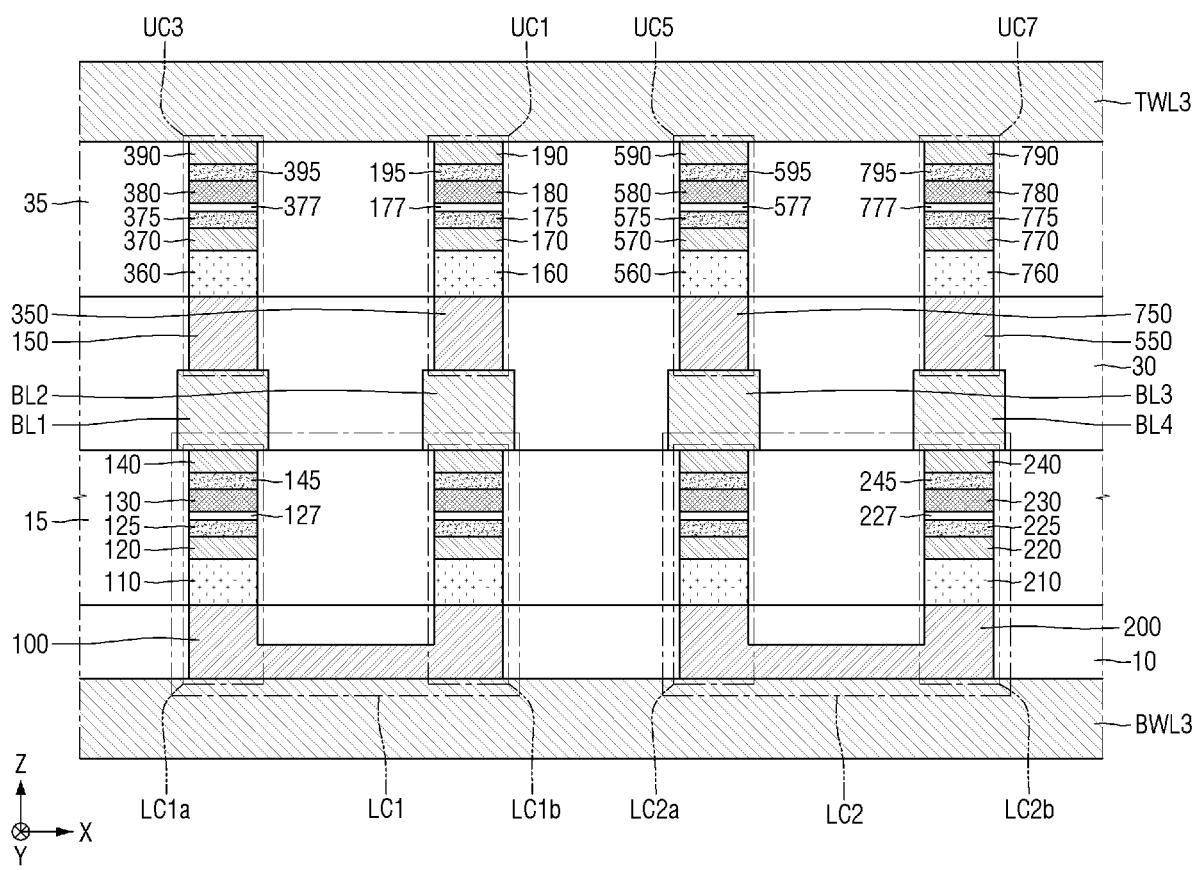

Subsequently, referring to FIG. 23, a third top word line TWL3 is formed.

The third top word line TWL3 may be extended in the first direction X and may come in contact with the first upper-cell upper-electrode 190, the third upper-cell upper-electrode 390, the fifth upper-cell upper-electrode 590, and the seventh upper-cell upper-electrode 790.

What is claimed is:

1. A method of fabricating a semiconductor device, the method comprising:
    forming a pre first electrode,
    forming a pre first carbon layer on the pre first electrode,
    forming a pre OTS layer on the pre first carbon layer,
    forming a pre second carbon layer on the pre OTS layer,
    forming a pre tunneling oxide layer between the pre first carbon layer and the pre second carbon layer, and
    patterning the pre first electrode, the pre first carbon layer, the pre tunneling oxide layer, the pre OTS layer, and the pre second carbon layer to form a first memory cell,
    wherein the pre first carbon layer contacts the pre first electrode, and
    wherein the pre OTS layer contains a chalcogenide.

2. The method of fabricating the semiconductor device of claim 1, wherein the pre tunneling oxide layer is formed between the pre first carbon layer and the pre OTS layer or between the pre second carbon layer and the pre OTS layer.

3. The method of fabricating the semiconductor device of claim 1, further comprises:
    forming a first word line extending in a first direction, before forming the first memory cell; and
    forming a bit line on the first memory cell, extending in a second direction intersecting the first direction,
    wherein first memory cell is formed between the first word line and the bit line.

4. The method of fabricating the semiconductor device of claim 3, further comprises:
    forming a second memory cell on the bit line; and
    forming a second word line on the second memory cell, extending in the first direction.

5. The method of fabricating the semiconductor device of claim 4, wherein the second memory cell has the same structure as the first memory cell.

6. The method of fabricating the semiconductor device of claim 1, wherein a thickness of the pre tunneling oxide layer ranges from 5 to 50 Å.

7. The method of fabricating the semiconductor device of claim 1, wherein the pre tunneling oxide layer comprises at least one of $SiO_2$, $AlO_x$, $TiO_x$, $TaO_x$, and $HfO_x$.

8. A method of fabricating a semiconductor device, the method comprising:
    forming a first electrode,
    stacking a pre second electrode, a pre first carbon layer, a pre tunneling oxide layer, a pre OTS layer, a pre second carbon layer, and a pre third electrode on the first electrode, sequentially,
    patterning the pre second electrode, the pre first carbon layer, the pre tunneling oxide layer, the pre OTS layer, the pre second carbon layer, and the pre third electrode to form a first memory cell, and
    forming a first mold layer surrounding the first memory cell,
    wherein the pre OTS layer contains a chalcogenide,
    wherein the pre tunneling oxide layer is formed with a first thickness, and
    wherein a threshold voltage of the first memory cell increases as the first thickness increases.

9. The method of fabricating the semiconductor device of claim 8, wherein the first thickness ranges from 5 to 50 Å.

10. The method of fabricating the semiconductor device of claim 8, further comprises:
    forming a second mold layer surrounding the first electrode, before forming the first memory cell,
    wherein the pre tunneling oxide layer is patterned using an etching selectivity ratio of the second mold layer and the pre tunneling oxide layer.

11. The method of fabricating the semiconductor device of claim 10,
    wherein the second mold layer is formed using a first plasma, and
    wherein the first plasma includes $N_2$ plasma and $NH_3$ plasma.

12. The method of fabricating the semiconductor device of claim 8, further comprises:
    forming a first word line extending in a first direction, before forming the first memory cell; and
    forming a bit line on the first memory cell, extending in a second direction intersecting the first direction,
    wherein the first memory cell is formed between the first word line and the bit line.

13. The method of fabricating the semiconductor device of claim 12, further comprises:
    forming a second memory cell on the bit line; and
    forming a second word line on the second memory cell, extending in the first direction.

14. The method of fabricating the semiconductor device of claim 8,
    wherein the pre tunneling oxide layer comprises at least one of $SiO_2$, $AlO_x$, $TiO_x$, $TaO_x$, and $HfO_x$.

15. A method of fabricating a semiconductor device, the method comprising:
    forming a first word line extending in a first direction,
    forming a first memory cell on the first word line,
    forming a bit line on the first memory cell, extending in a second direction intersecting the first direction,
    forming a second memory cell on the bit line, and
    forming a second word line on the second memory cell, extending in the first direction,
    wherein the first memory cell comprises a first carbon layer, an OTS layer on the first carbon layer, a second carbon layer on the OTS layer, and at least one tunneling oxide layer between the first carbon layer and the second carbon layer, and
    wherein the OTS layer contains a chalcogenide.

16. The method of fabricating the semiconductor device of claim 15, wherein the at least one tunneling oxide layer is disposed between the OTS layer and the first carbon layer or between the OTS layer and the second carbon layer.

17. The method of fabricating the semiconductor device of claim 15, wherein the at least one tunneling oxide layer comprises a first tunneling oxide layer between the OTS layer and the first carbon layer and a second tunneling oxide layer between the OTS layer and the second carbon layer.

18. The method of fabricating the semiconductor device of claim 15, wherein the at least one tunneling oxide layer comprises at least one of $SiO_2$, $AlO_x$, $TiO_x$, $TaO_x$, and $HfO_x$.

19. The method of fabricating the semiconductor device of claim 15,
    wherein the at least one tunneling oxide layer has a first thickness, and
    wherein a threshold voltage of the first memory cell increases as the first thickness increases.

20. The method of fabricating the semiconductor device of claim 19, wherein the first thickness ranges from 5 to 50 Å.

* * * * *